(12) United States Patent
Sakashita et al.

(10) Patent No.: US 8,434,856 B2
(45) Date of Patent: May 7, 2013

(54) PEROVSKITE OXIDE, PROCESS FOR PRODUCING THE PEROVSKITE OXIDE, PIEZOELECTRIC BODY, PIEZOELECTRIC DEVICE, AND LIQUID DISCHARGE DEVICE

(75) Inventors: Yukio Sakashita, Kanagawa-ken (JP); Tsutomu Sasaki, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/040,592

(22) Filed: Mar. 4, 2011

(65) Prior Publication Data

US 2011/0216132 A1 Sep. 8, 2011

Related U.S. Application Data

(62) Division of application No. 11/898,621, filed on Sep. 13, 2007, now Pat. No. 7,918,542.

(30) Foreign Application Priority Data

Sep. 15, 2006 (JP) ................................. 2006-250389

(51) Int. Cl.
*B41J 2/045* (2006.01)
*C01B 13/00* (2006.01)
(52) U.S. Cl.
USPC ........................... 347/68; 423/593.1; 423/598
(58) Field of Classification Search ............... 423/593.1, 423/594.1, 594.2, 594.3, 594.4, 595, 598; 347/68; 310/358, 359
See application file for complete search history.

(56) References Cited

U.S. PATENT DOCUMENTS

| 3,144,411 | A | 8/1964 | Kuicsar et al. |
| 3,372,121 | A | 3/1968 | Banno |
| 3,484,377 | A | 12/1969 | Tsubouchi et al. |
| 5,453,262 | A | 9/1995 | Dawson et al. |
| 6,160,472 | A | 12/2000 | Arashi et al. |
| 7,622,852 | B2 | 11/2009 | Ifuku et al. |
| 7,918,542 | B2* | 4/2011 | Sakashita et al. ............... 347/68 |
| 2002/0185935 | A1 | 12/2002 | Yamamoto et al. |
| 2003/0031622 | A1 | 2/2003 | Eitel et al. |
| 2003/0134738 | A1 | 7/2003 | Furukawa et al. |
| 2004/0119378 | A1 | 6/2004 | Mizuno |

(Continued)

FOREIGN PATENT DOCUMENTS

| CN | 1395549 A | 2/2003 |
| CN | 1532917 A | 9/2004 |

(Continued)

OTHER PUBLICATIONS

Alberta et al.; High Temperature Morphotropic Phase Boundary Piezoelectrics; IEEE Ultrasonics Symposium Proceedings; vol. 2; p. 1991-1994: New York, NY; US; Oct. 5, 2003.

(Continued)

*Primary Examiner* — Daniel Petkovsek
(74) *Attorney, Agent, or Firm* — Birch, Stewart, Kolasch & Birch, LLP

(57) ABSTRACT

A process for producing a piezoelectric oxide having a composition (A, B, C)(D, E, F)O₃, where each of A, B, C, D, E, and F represents one or more metal elements. The composition is determined so as to satisfy the conditions (1), (2), (3), and (4), $$0.98 \leq TF(P) \leq 1.01, \quad (1)$$

$$TF(ADO_3) > 1.0, \quad (2)$$

$$TF(BEO_3) < 1.0, \text{ and} \quad (3)$$

$$TF(BEO_3) < TF(CFO_3) < TF(ADO_3), \quad (4)$$

where TF(P) is the tolerance factor of the perovskite oxide, and $TF(ADO_3)$, $TF(BEO_3)$, and $TF(CFO_3)$ are respectively the tolerance factors of the compounds $ADO_3$, $BEO_3$, and $CFO_3$.

31 Claims, 13 Drawing Sheets

U.S. PATENT DOCUMENTS

| | | | |
|---|---|---|---|
| 2004/0139911 | A1 | 7/2004 | Chiang et al. |
| 2004/0207288 | A1 | 10/2004 | Funakubo et al. |
| 2004/0229384 | A1 | 11/2004 | Kijima et al. |
| 2005/0006620 | A1 | 1/2005 | Helke |
| 2005/0218756 | A1 | 10/2005 | Fujii et al. |
| 2006/0118844 | A1 | 6/2006 | Kijima et al. |
| 2007/0060467 | A1 | 3/2007 | Matsuda et al. |

FOREIGN PATENT DOCUMENTS

| | | |
|---|---|---|
| CN | 1706007 A | 12/2005 |
| EP | 1 400 498 A2 | 3/2004 |
| JP | 45-15346 | 5/1970 |
| JP | 59-182273 A | 10/1984 |
| JP | 9-241072 A | 9/1997 |
| JP | 2000-326506 | 11/2000 |
| JP | 2004-59369 A | 2/2004 |
| JP | 3568107 B2 | 9/2004 |
| JP | 2005-333108 A | 12/2005 |
| JP | 2006-036578 A | 2/2006 |
| JP | 2006-165258 A | 6/2006 |
| JP | 2007-84424 A | 4/2007 |
| WO | WO 03/029162 A2 | 4/2003 |
| WO | WO 2007/034903 A1 | 3/2007 |

OTHER PUBLICATIONS

Interview Summary issued Sep. 24, 2010 in connection with U.S. Appl. No. 11/898,621.

Kim et al.; Influences of Cr Doping on the Electrical Properties in BiFeO3 Thin Films; Ferroelectrics Letters; vol. 33: Nos. 3-4: pp. 91-100; Taylor and Francis Inc.; US; Aug. 1, 2006.

L. A. Reznitchenko et al.; Phase Diagrams and Ferroelectric Properties of Solid Solutions of the Ternary Systems . . . ; Ferroelectrics, vol. 247 (1-3); pp. 125-133; 2000.

L.A. Reznichenko et al.; The Phase Diagram and Properties of Solid Solutions of the Ternary Sodium-Lithium-Potassium Niobate System; Technical Physics Letters; vol. 28; No. 2: pp. 83-86; (2002).

Notice of Allowability issued Mar. 2, 2011 in connection with U.S. Appl. No. 11/898,621.

O. A. Demchenko et al.; Concentration Dependences of the Properties of Multicomponent PZT-Based Piezoelectric Ceramics in the Morphotropic Transition Range; Technical Physics; vol. 50; No. 9; pp. 1170-1177; 2005.

Office Action issued Jun. 16, 2010 in connection with U.S. Appl. No. 11/898,621.

Office Action issued Oct. 15, 2010 in corresponding European Patent Application No. 07018069.0.

Okada et al.; Synthesis of Bi(FexAl1-x)O3 Thin Films by Pulsed Laser Deposition and its Structural Characterization; Japanese Journal of Applied Physics; vol. 43; No. 9B; pp. 6609-6612; The Japan Society of Applied Physics; Tokyo; JP; Sep. 1, 2004; XP-001229973.

R. Bertram et al.; Growth an correlation between composition and structure of . . . ; Journal of Crystal Growth; vol. 253: pp. 212-220; 2003.

S. Yokoyama et al.; Compositional Dependence of Electrical Properties of Highly (100)-/(001)-Oriented Pb(Zr, Ti)O3 Thick Films Prepared on Si Substrates by Metalorganic Chemical Vapor Deposition, Japanese Journal of Applied Physics; vol. 42; pp. 5922-5926: 2003.

Shrout et al.; High Performance, High Temperature Perovskite Piezoelectrics; Applications of Ferroelectrics; pp. 126-129; International Symposium in Montreal, Canada; Piscataway, NJ; USA; Aug. 23, 2004.

Takahashi et al.; Influence of Mn Doping on Ferroelectric-Antiferromagnet BiFeO3 Thin Films Grown on (LaAlO3)0.3(Sr2AlTaO6)0.7 Substrates; Japanese Journal of Applied Physics; vol. 45; Nos. 29-32, pp. 755-757; The Japan Society of Applied Physics; Aug. 2006; XP-002530939.

Zhai et al.; Electric fatigue in Pb(Nb, Zr, Sn, Ti)O3 thin films grown by a sol-gel process; Applied Physics Letters; vol. 83; No. 5; pp. 978-980; American Institute of Physics, Melville, NY; US; Aug. 4, 2003.

Chinese Office Action issued on Jun. 6, 2012 in corresponding Chinese patent application 2007101542712 (partial English translation is attached).

Chinese Office Action dated Sep. 21, 2011 issued in corresponding Chinese patent application No. 200710154271.2 (partial English translation attached).

Japanese Office Action issued Oct. 4, 2011 in corresponding Japanese patent application No. JP 2007-235091 (partial English translation attached).

Norihiko Sakamoto et al.; Dielectric Properties of Sr1-x-yCaxBayTiO3 with Fixed Lattice Constants; Proceedings of 13th Fall symposium, Japan, The Ceramic Society of Japan, Oct. 11, 2000, p. 40.

Japanese Office Action issued on Aug. 28, 2012 in corresponding Japanese patent application No. 2007-235091 (English translation is attached).

* cited by examiner

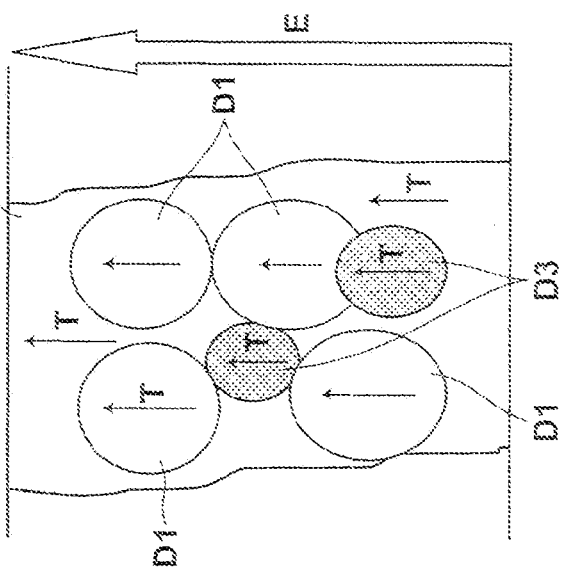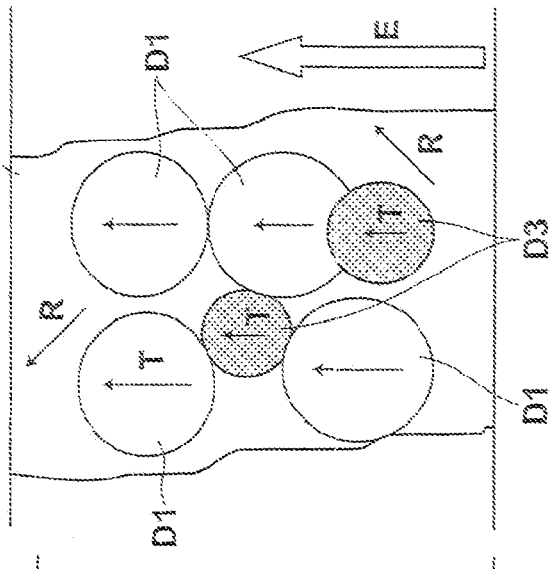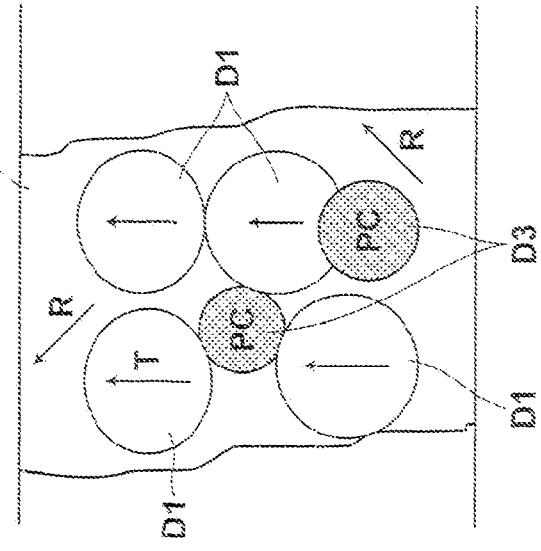

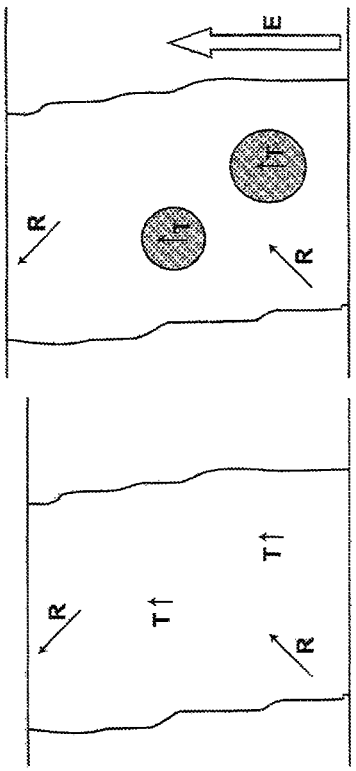

PEROVSKITE OXIDE, PROCESS FOR PRODUCING THE PEROVSKITE OXIDE, PIEZOELECTRIC BODY, PIEZOELECTRIC DEVICE, AND LIQUID DISCHARGE DEVICE

This application is a Divisional Application of application Ser. No. 11/898,621 filed on Sep. 13, 2007 now U.S. Pat. No. 7,918,542, and for which priority is claimed under 35 U.S.C. §120; and this application claims priority under 35 U.S.C. §119 of Application No. JP 2006-250389 filed in Japan on Sep. 15, 2006; the entire contents of all are hereby incorporated by reference.

BACKGROUND OF THE INVENTION

1. Field of the Invention

The present invention relates to a perovskite oxide, a process for producing the perovskite oxide, a ferroelectric compound containing the perovskite oxide, a piezoelectric body, a piezoelectric device using the piezoelectric body, and a liquid discharge device using the piezoelectric body.

2. Description of the Related Art

Currently, piezoelectric devices constituted by a piezoelectric body and electrodes are used as, for example, actuators installed in inkjet recording heads. In the piezoelectric devices, the piezoelectric body expands and contracts according to increase and decrease in the strength of an electric field applied from the electrodes to the piezoelectric body in a predetermined direction. For example, perovskite oxides such as PZT (lead titanate zirconate) are known as materials suitable for the piezoelectric body. Such materials are ferroelectric materials which exhibit spontaneous polarization even when no electric field is applied. The piezoelectric materials are reported to exhibit high piezoelectric performance at and near the morphotropic phase boundary (MPB).

PZT is a solid solution of $PbTiO_3$ (PT) and $PbZrO_3$ (PZ). FIG. 14 is a phase diagram of PZT with respect to the temperature and the mole fraction of titanium (i.e., the mole fraction of $PbTiO_3$) in PZT. The phase diagram of FIG. 14 is cited from "Landolt-Bornstein: Numerical Data and Functional Relationships in Science and Technology, New Series," Group III: Crystal and Solid State Physics, Vol. 16, edited by K. H. Hellwege and A. M. Hellwege, Springer-Verlag Berlin-Heidelberg-New York (1981) p. 426 & FIG. 728. In FIG. 14, FT denotes the tetragonal phase, and FR denotes the rhombohedral phase.

PZT tends to form tetragonal crystals when the Ti composition is high, and rhombohedral crystals when the Zr composition is high. When the molar compositions of Ti and Zr are approximately identical, the MPB composition is achieved. For example, the mole ratio of Zr to Ti of 52/48, which is near to the MPB composition, is preferable. The textbooks on the piezoelectric ceramic materials teach that the crystal structures become unstable and the piezoelectric performance becomes highest at and near the MPB. Conventionally, PZT has been reported to form pseudocubic crystals at and near the MPB. However, details of the nanostructure of PZT are unknown.

In the above circumstances, the Japanese Unexamined Patent Publication No. 2006-036578 (hereinafter referred to as JP2006-036578) reports that sintered bodies of PZT-based ceramic materials such as $Pb(Ti, Zr, Nb)O_3$ are formed of two-phase mixed crystals of tetragonal crystals and rhombohedral crystals at and near the MPB. (See, for example, claim 9 in JP2006-036578.) Further, JP2006-036578 discloses that it is possible to desirably design the composition on the basis of the relationship between the piezoelectric coefficient and the phase fractions of the tetragonal and rhombohedral phases. (See, for example, Table 1, FIG. 4, and the paragraph 0027 in JP2006-036578.)

In addition, S. Yokoyama et al., "Compositional Dependence of Electrical Properties of Highly (100)-/(001)-Oriented $Pb(Zr, Ti)O_3$ Thick Films Prepared on Si Substrates by Metalorganic Chemical Vapor Deposition", Japanese Journal of Applied Physics, Vol. 42, pp. 5922-5926, 2003 also report that PZT films are formed of two-phase mixed crystals of tetragonal crystals and rhombohedral crystals at and near the MPB. (See, for example, FIG. 2(b) in the Yokoyama reference.)

However, in the conventional piezoelectric devices of a first type, the piezoelectric effect of expansion of a ferroelectric body in the direction of the spontaneous polarization is generally utilized by applying an electric field to the ferroelectric body along the direction of the spontaneous polarization. That is, it has been conventionally considered important to design the piezoelectric materials so that the electric field is applied along the direction of the spontaneous polarization. Nevertheless, in the case where only the piezoelectric effect of expansion in the direction of the spontaneous polarization is utilized, the amount of displacement is limited, although greater displacement is currently demanded.

The Japanese Patent No. 3568107 (hereinafter referred to as JP3568107) proposes the conventional piezoelectric devices of a second type, in which application of an electric field induces phase transition in a piezoelectric body. JP3568107 discloses a piezoelectric device constituted by a phase-transition film, electrodes, and a heating body, where the heating body adjusts the temperature of the phase-transition film to a level near to the Curie point Tc. (See claim 1 in JP3568107.) JP3568107 refers to use, as the phase-transition film, of a film in which transition occurs between a tetragonal phase and a rhombohedral phase or between a cubic phase and a tetragonal or rhombohedral phase. (See claim 2 in JP3568107.) Further, JP3568107 reports that the conventional piezoelectric devices of the second type disclosed in JP3568107 can achieve greater displacement than the conventional piezoelectric devices of the first type because both of the piezoelectric effect of the ferroelectric material and the change in the crystal structure associated with the phase transition contribute to the displacement.

As explained above, although PZT has been conventionally reported to form pseudocubic crystals at and near the MPB, JP2006-036578 and the Yokoyama reference report that PZT-based ceramic materials form a two-phase mixed-crystal structure containing a tetragonal phase and a rhombohedral phase at and near the MPB. However, many aspects of the piezoelectric mechanism and the crystal structure at and near the MPB are still unknown.

In addition, according to the technique disclosed in JP2006-036578, it is necessary to prepare samples of perovskite oxides each constituted by a plurality of predetermined elements with different mole fractions, obtain the phase fractions of the tetragonal and rhombohedral phases in each sample by X-ray diffraction and Rietveld analysis, obtain the piezoelectric coefficient of each sample, and determine the composition on the basis of the relationship between the obtained phase fractions and the piezoelectric coefficient. However, according to the above technique, it is necessary to search for desirable composition by performing an experiment every time the constituent elements of the sample are changed, so that the material design cannot be efficiently made by the technique.

Incidentally, as mentioned before, JP3568107 refers to the use, as the phase-transition film, of films in which phase transition occurs between a tetragonal system and a rhombohedral system or between a cubic system and a tetragonal or rhombohedral system. However, the piezoelectric devices disclosed in JP3568107 are assumed to be used in the vicinity of the Curie point Tc. Since the Curie point Tc corresponds to the phase-transition temperature between the ferroelectric phase and the paraelectric phase, the phase transition between the tetragonal phase and the rhombohedral phase occurs in no film when the film is used in the vicinity of the Curie point Tc. That is, the piezoelectric devices disclosed in JP3568107 cannot utilize the phase transition other than the phase transition between the ferroelectric phase and the paraelectric phase. In addition, since spontaneous polarization does not occur in the paraelectric material, the piezoelectric devices disclosed in JP3568107 do not exhibit the piezoelectric effect of expansion in the direction of the polarization in response to application of an electric field after the phase transition.

The present inventor and colleagues belonging to the present assignee have proposed in the International Patent Application Publication No. WO2007/034903 (which is hereinafter referred to as WO2007/034903) a piezoelectric device using a piezoelectric body which contains regions in a first ferroelectric phase having crystal orientation. In the piezoelectric body, the phase of at least a portion of the above regions transitions from the first ferroelectric phase corresponding to a first crystal system to a second ferroelectric phase corresponding to a second crystal system different from the first crystal system when an electric field is applied to the piezoelectric body.

In the above piezoelectric device, it is possible to achieve a volume change caused by a change in the crystal structure associated with the phase transition from the first ferroelectric phase. In addition, since the piezoelectric effect works in both of the first ferroelectric phase (before the phase transition) and the second ferroelectric phase (after the phase transition), the piezoelectric device disclosed in WO2007/034903 exhibits greater displacement than the piezoelectric devices disclosed in JP3568107 when the electric field is applied to the piezoelectric body.

Further, WO2007/034903 reports that the engineered-domain effect and the like increase the distortion amount (displacement) when the direction along which the electric field is applied to the piezoelectric body is different from the orientation of the spontaneous polarization axis in the ferroelectric phase before the phase transition, and is preferably approximately identical to the orientation of the spontaneous polarization axis in the ferroelectric phase after the phase transition.

SUMMARY OF THE INVENTION

The present invention has been made in view of such circumstances.

The first object of the present invention is to provide a process for producing a perovskite oxide on the basis of a novel material design principle proposed for designing a perovskite oxide superior in the piezoelectric performance (i.e., the ferroelectric performance), where the process is particularly suitable for producing a perovskite oxide for use in the piezoelectric device exploiting the phase transition induced by application of an electric field as proposed in WO2007/034903.

The second object of the present invention is to provide a perovskite oxide which is produced by the above process.

The third object of the present invention is to provide a ferroelectric compound and a piezoelectric body containing a perovskite oxide which is produced by the above process.

The fourth object of the present invention is to provide a piezoelectric device and a liquid discharge device using the above piezoelectric body.

(I) In order to accomplish the above first object, according to the first aspect of the present invention, a process for producing a perovskite oxide is provided. In addition, in order to accomplish the above second object, according to the second aspect of the present invention, the perovskite oxide produced by the process according to the first aspect of the present invention is provided. The perovskite oxide has a composition expressed by the compositional formula, $$(A,B,C)(D,E,F)O_3, \quad (P)$$

where each of A, B, C, D, E, and F represents one or more metal elements, A, B, and C represent A-site elements, D, E, and F represent B-site elements, and O represents the oxygen atom. The A-site elements A, B, and C may be different, or two or all of the A-site elements A, B, and C may be identical. However, when two or all of the A-site elements A, B, and C are identical, the B-site elements D, E, and F are different. In addition, the B-site elements D, E, and F may be different, or two or all of the B-site elements D, E, and F may be identical. However, when two or all of the B-site elements D, E, and F are identical, the A-site elements A, B, and C are different. Although the ratio of each of the total molar amount of the A-site elements and the total molar amount of the B-site elements to the molar amount of oxygen atoms is normally 1:3, the ratio of each of the total molar amount of the A-site elements and the total molar amount of the B-site elements to the molar amount of oxygen atoms may deviate from 1:3 within a range in which the composition expressed by the compositional formula $(A, B, C)(D, E, F)O_3$ can form a perovskite structure. The process according to the first aspect of the present invention is characterized in that the composition of the compound $(A, B, C)(D, E, F)O_3$ is determined so as to satisfy the conditions expressed by the inequalities (1) to (4).

$$0.98 \leq TF(P) \leq 1.01 \quad (1)$$

$$TF(ADO_3) > 1.0 \quad (2)$$

$$TF(BEO_3) < 1.0 \quad (3)$$

$$TF(BEO_3) < TF(CFO_3) < TF(ADO_3). \quad (4)$$

In this specification, TF(X) is the tolerance factor of an oxide expressed by the compositional formula X, although the tolerance factor of the perovskite oxide $(A, B, C)(D, E, F)O_3$ is expressed as TF(P). The tolerance factor is defined as $$TF = (rA + rO)/\sqrt{2}(rB + rO),$$

where rA is the average ionic radius of the A-site element, rB is the average ionic radius of the B-site element, and rO is the ionic radius of the oxygen ion. In this specification; the ionic radius is the Shannon ionic radius. (See R. D. Shannon, "Revised effective ionic radii and symmetric studies of interatomic distances in halides and chalcogenides", Acta Crystallographica, A32, pp. 751-767, 1976). The average ionic radius is expressed by $\Sigma CiRi$, where Ci indicates the mole fraction of each ion in a lattice site, and Ri is the ionic radius of the ion.

According to the first aspect of the present invention, the tolerance factor of each of the oxides $(A, B, C)(D, E, F)O_3$, $ADO_3$, $BEO_3$, and $CFO_3$ is theoretically obtained, and the composition of the perovskite oxide $(A, B, C)(D, E, F)O_3$ is determined as above. At this time, even when one or more of the oxides do not form a perovskite structure by themselves, the tolerance factor of each of the oxides is theoretically obtained.

Preferably, the perovskite oxide may be produced by the process according to the first aspect of the present invention so that the perovskite oxide further has one or any possible combination of the following additional features (i) to (iv), and the perovskite oxide according to the second aspect of the present invention may further comprise one or any possible combination of the following additional features (i) to (iv).

(i) It is preferable that the composition of the perovskite oxide (A, B, C) (D, E, F)$O_3$ be determined so as to further satisfy the condition expressed by the inequalities (5). That is, it is preferable that the composition of the perovskite oxide according to the second aspect of the present invention further satisfy the condition expressed by the inequalities (5).

$$0.98 \leq TF(CFO_3) \leq 1.02 \qquad (5)$$

(ii) The phase structure of the perovskite oxide is not specifically limited. For example, the perovskite oxide may have a three-phase mixed-crystal structure in which the three components $ADO_3$, $BEO_3$, and $CFO_3$ coexist, or a single-phase structure in which the three components $ADO_3$, $BEO_3$, and $CFO_3$ are completely solid solved into a single phase. Further, the perovskite oxide may have another structure.

(iii) It is preferable that the perovskite oxide according to the second aspect of the present invention contain the first component $ADO_3$, the second component $BEO_3$, and the third component $CFO_3$. In each of the first component $ADO_3$, the second component $BEO_3$, and the third component $CFO_3$, the ratio of each of the molar amount of the A-site element and the molar amount of the B-site element to the molar amount of oxygen atoms is normally 1:3. However, the ratio of each of the molar amount of the A-site element and the molar amount of the B-site element to the molar amount of oxygen atoms may deviate from 1:3 within a range in which each of the first component $ADO_3$, the second component $BEO_3$, and the third component $CFO_3$ can form a perovskite structure.

(iv) In the perovskite oxide having the feature (iii), it is also preferable that the first component $ADO_3$ and the second component $BEO_3$ form structures respectively corresponding to different crystal systems, and it is particularly preferable that the first component $ADO_3$, the second component $BEO_3$, and the third component $CFO_3$ form structures respectively corresponding to different crystal systems.

For example, the perovskite oxide may have a three-phase mixed-crystal structure in which the first component forms a first crystal structure corresponding to one of tetragonal, orthorhombic, monoclinic, trigonal, and rhombohedral systems, the second component forms a second crystal structure corresponding to one of tetragonal, orthorhombic, and rhombohedral systems which is different from the first crystal structure, and the third component forms a third crystal structure corresponding to one of cubic and pseudocubic systems.

An example of the perovskite oxide according to the second aspect of the present invention has the composition expressed by the compositional formula, $Pb(Ti,Zr,M)O_3,$ \hfill (PX)

where M in the compound Pb (Ti, Zr, M)$O_3$ is at least one of the metal elements Sn, Nb, Ta, Mo, W, Ir, Os, Pd, Pt, Re, Mn, Co, Ni, V, and Fe.

Another example of the perovskite oxide according to the second aspect of the present invention has the composition expressed by the compositional formula, $(Ba,Ca,Sr)(Ti,Zr,M)O_3,$ \hfill (PY)

where M in the compound (Ba, Ca, Sr) (Ti, Zr, M)$O_3$ is at least one of the metal elements Sn, Nb, Ta, Mo, W, Ir, Os, Pd, Pt, Re, Mn, Co, Ni, V, and Fe.

A further example of the perovskite oxide according to the second aspect of the present invention has the composition expressed by the compositional formula, $Bi(Al,Fe,M)O_3,$ \hfill (PW)

where M in the compound Bi (Al, Fe, M)$O_3$ is at least one of the metal elements Cr, Mn, Co, Ni, Ga, and Sc.

(II) In addition, in order to accomplish the aforementioned second object, a perovskite oxide according to the third aspect of the present invention is also provided. The piezoelectric body according to the third aspect of the present invention is characterized in having a composition at or near a morphotropic phase boundary (MPB), and a mixed-crystal structure composed of at least two first crystal phases which are ones of tetragonal, orthorhombic, and rhombohedral phases, and at least one second crystal phase which is at least one of cubic and pseudocubic phases.

Further, in order to accomplish the aforementioned second object, a perovskite oxide according to the fourth aspect of the present invention is also provided. The piezoelectric body according to the fourth aspect of the present invention is characterized in having a composition at or near the morphotropic phase boundary (MPB), and exhibits in a high-resolution X ray diffraction profile a first diffraction peak of a tetragonal phase, a second diffraction peak of a rhombohedral phase, and a third diffraction peak of a third phase different from the tetragonal phase and rhombohedral phases.

In this specification, the expression "at or near the MPB" means that the composition of the perovskite oxide is in a range of the composition in which the phase of the perovskite oxide transitions when an electric field is applied to the perovskite oxide.

(III) In order to accomplish the aforementioned third object, a ferroelectric compound according to the fifth aspect of the present invention is provided. The ferroelectric compound according to the fifth aspect of the present invention is characterized in containing the perovskite oxide according to one of the second to fourth aspects of the present invention.

In addition, in order to accomplish the aforementioned third object, a piezoelectric body according to the sixth aspect of the present invention is also provided. The piezoelectric body according to the sixth aspect of the present invention is characterized in containing the perovskite oxide according to one of the second to fourth aspects of the present invention. The piezoelectric body may be, for example, a piezoelectric film or a sintered body of a piezoelectric ceramic material.

Preferably, the above piezoelectric body according to the sixth aspect of the present invention may further comprise one or any possible combination of the following additional features (v) to (viii).

(v) It is preferable that the piezoelectric body according to the sixth aspect of the present invention contain a ferroelectric phase having crystal orientation. In this specification, the expression "having crystal orientation" means that the degree F. of orientation measured by the Lotgering technique is 800 or higher. The degree F. of orientation defined as $$F(\%) = (P - P0)/(1 - P0) \times 100,$$

where P is the ratio of the total XRD (X-ray diffraction) intensity from an orientation plane to the total XRD intensity from all the crystal planes, and P0 is the value of P in the case where the sample is completely randomly oriented. In the case of the (001) orientation, $P = \Sigma I(001)/\Sigma I(hkl)$, where $I(hkl)$ is the XRD intensity from the crystal plane (hkl), $\Sigma I(001)$ is the total XRD intensity from the crystal plane (001), and ΣI(hkl) is the total XRD intensity from all the crystal planes (hkl). For example, in the case of the (001) orientation in a perovskite crystal, P=I(001)/{I(001)+I(100)+I(101)+I(110)+I(111)}. When the sample is completely randomly oriented, F=0%. When the sample is completely oriented, F=100%.

(vi) It is preferable that the piezoelectric body according to the sixth aspect of the present invention contain a region in a ferroelectric phase (ferroelectric region) having crystal orientation along a direction different from the orientation of the spontaneous polarization axis.

(vii) In the case where the piezoelectric body according to the sixth aspect of the present invention has the feature (vi), it is further preferable that the ferroelectric phase be one of a rhombohedral phase having crystal orientation along approximately the <100> direction, a rhombohedral phase having crystal orientation along approximately the <110> direction, a tetragonal phase having crystal orientation along approximately the <110> direction, a tetragonal phase having crystal orientation along approximately the <111> direction, an orthorhombic phase having crystal orientation along approximately the <100> direction, and an orthorhombic phase having crystal orientation along approximately the <111> direction. In this specification, the expression "having crystal orientation along approximately the <abc> direction" means that the degree F of orientation along the <abc> direction is 800 or higher.

(viii) In the case where the piezoelectric body according to the sixth aspect of the present invention has the feature (vi) or (vii), it is further preferable that at least a portion of the above ferroelectric phase contained in the piezoelectric body according to the sixth aspect of the present invention transition when an electric field is applied to the piezoelectric body along a direction different from the orientation of the spontaneous polarization axis.

(IV) In order to accomplish the aforementioned fourth object, a piezoelectric device according to the seventh aspect of the present invention is provided. The piezoelectric device according to the seventh aspect of the present invention is characterized in comprising the piezoelectric body according to the sixth aspect of the present invention and electrodes through which an electric field is applied to the piezoelectric body.

In addition, in order to accomplish the aforementioned fourth object, a liquid discharge device according to the eighth aspect of the present invention is also provided. The liquid discharge device according to the eighth aspect of the present invention is characterized in comprising the piezoelectric device according to the seventh aspect of the present invention, a substrate, and a discharge member. The piezoelectric device is arranged above the substrate. The discharge member is formed integrally with or separately from the substrate, and includes a liquid-reserve chamber and a liquid-discharge outlet, where the liquid-reserve chamber reserves liquid, and the liquid reserved in the liquid-reserve chamber is externally discharged through the liquid-discharge outlet.

(v) The present invention has the following advantages.

(a) The first aspect of the present invention presents a novel material design principle for producing a perovskite oxide superior in the piezoelectric (ferroelectric) performance. Therefore, according to the first aspect of the present invention, it is possible to easily design the composition of the perovskite oxide superior in the piezoelectric (ferroelectric) performance.

(b) The material design principle presented by the first aspect of the present invention is suitable for designing the composition of a perovskite oxide for use in the system utilizing phase transition induced by an electric field as proposed in WO2007/034903. According to the present invention, it is possible to provide a perovskite oxide having such a domain structure that even when the strength of the electric field applied to the perovskite oxide is relatively low, phase transition can easily occur and great distortion (displacement) is produced.

(c) It is possible to provide a piezoelectric device having superior piezoelectric performance by using the perovskite oxide produced in accordance with the material design principle presented by the present invention.

DESCRIPTION OF THE DRAWINGS

FIGS. 3A, 3B, and 3C are diagrams illustrating examples of domains of three crystal systems in a phase transition model 1 for explaining effectiveness of use of the perovskite oxide according to the present invention in the system in which phase transition is induced by application of an electric field.

FIGS. 5A, 5B, and 5C are diagrams illustrating examples of domains of three crystal systems in a phase transition model 2 for explaining effectiveness of use of the perovskite oxide according to the present invention in the system in which phase transition is induced by application of an electric field.

DESCRIPTION OF PREFERRED EMBODIMENTS

Figure 1:
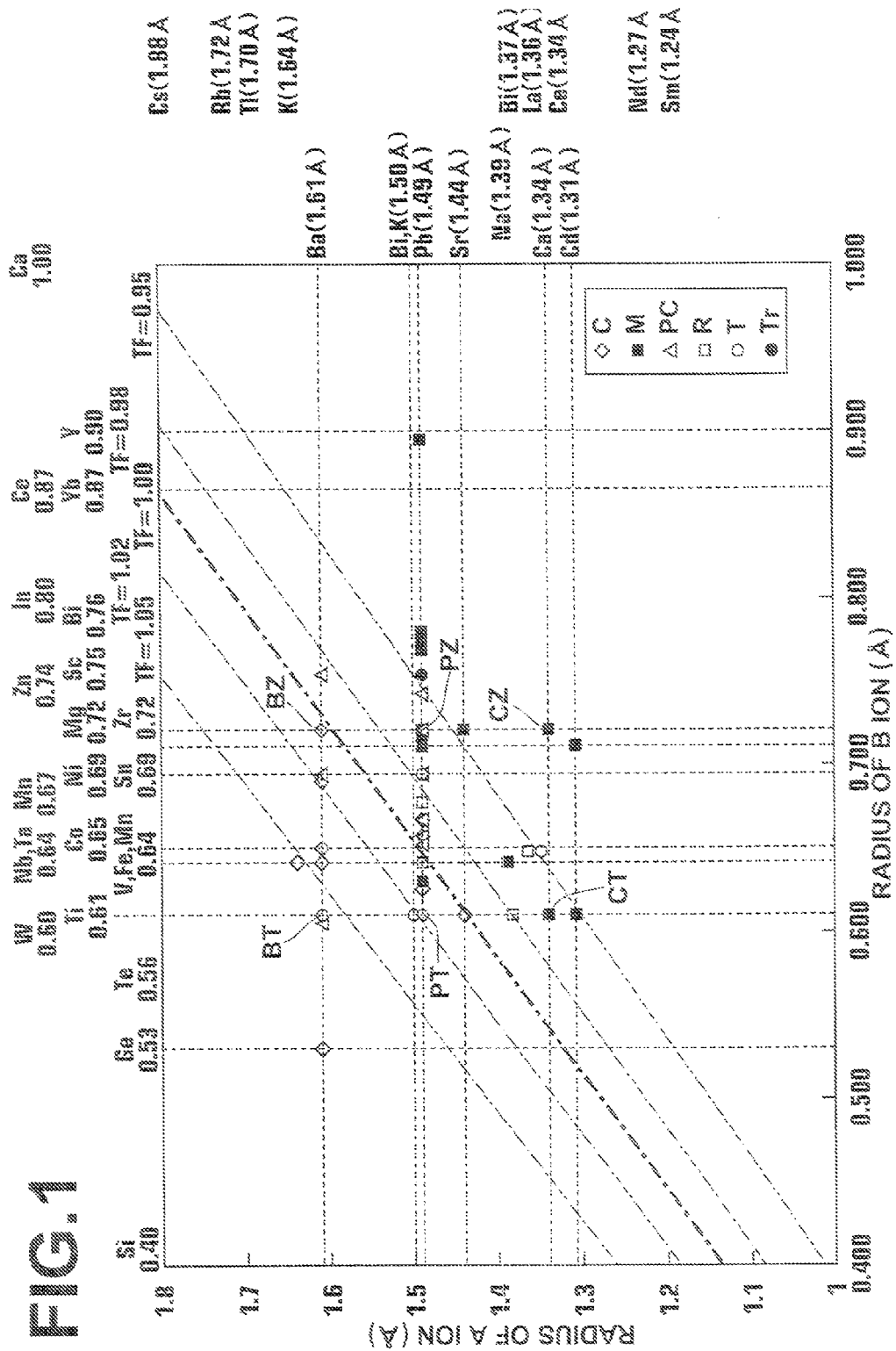
FIG. 1 is a diagram indicating the tolerance factors TF and the crystal systems of various perovskite oxides in association with the ionic radii of the A-site elements and the B-site elements.

A preferred embodiment of the present invention is explained in detail below with reference to drawings.

1. Perovskite Oxide

As explained in the "SUMMARY OF THE INVENTION", the first aspect of the present invention presents a process for producing a perovskite oxide expressed by the compositional formula, $$(A,B,C)(D,E,F)O_3, \tag{P}$$

where each of A, B, C, D, E, and F represents one or more metal elements, A, B, and C represent A-site elements, D, E, and F represent B-site elements, and O represents the oxygen element. The A-site elements A, B, and C may be different, or two or all of the A-site elements A, B, and C may be identical. However, when two or all of the A-site elements A, B, and C are identical, the B-site elements D, E, and F are different. In addition, the B-site elements D, E, and F may be different, or two or all of the B-site elements D, E, and F may be identical. However, when two or all of the B-site elements D, E, and F are identical, the A-site elements A, B, and C are different. Although the ratio of each of the total molar amount of the A-site elements and the total molar amount of the B-site elements to the molar amount of oxygen atoms is normally 1:3, the ratio of each of the total molar amount of the A-site elements and the total molar amount of the B-site elements to the molar amount of oxygen atoms may deviate from 1:3 within a range in which the composition expressed by the compositional formula (A, B, C) (D, E, F)$O_3$ can form a perovskite structure.

The process for producing the perovskite oxide according to the first aspect of the present invention is characterized in that the composition of the perovskite oxide (A, B, C) (D, E, F)$O_3$ is determined so as to satisfy the conditions expressed by the inequalities (1) to (4).

$$0.98 \leq TF(P) \leq 1.01 \tag{1}$$

$$TF(ADO_3) > 1.0 \tag{2}$$

$$TF(BEO_3) < 1.0 \tag{3}$$

$$TF(BEO_3) < TF(CFO_3) < TF(ADO_3). \tag{4}$$

Preferably, the composition of the perovskite oxide (A, B, C) (D, E, F)$O_3$ is determined so as to further satisfy the condition expressed by the inequalities (5).

$$0.98 \leq TF(CFO_3) \leq 1.02 \tag{5}$$

In the above inequalities (1) to (5), TF(X) is the tolerance factor of an oxide expressed by the compositional formula X, although the tolerance factor of the perovskite oxide (A, B, C) (D, E, F)$O_3$ is expressed as TF(P).

In addition, as explained in the "SUMMARY OF THE INVENTION", the second aspect of the present invention presents the above perovskite oxide produced by the process according to the first aspect of the present invention. That is, the perovskite oxide according to the second aspect of the present invention has the composition expressed by the above compositional formula (A, B, C) (D, E, F)$O_3$, and the perovskite oxide according to the second aspect of the present invention is characterized in that the composition of the perovskite oxide (A, B, C) (D, E, F)$O_3$ satisfies the conditions expressed by the above inequalities (1) to (4). Preferably, the composition of the perovskite oxide (A, B, C) (D, E, F)$O_3$ satisfies the condition expressed by the above inequalities (5).

In the case where all of the B-site elements D, E, and F are identical, the compositional formula (A, B, C) (D, E, F)$O_3$ can be expressed as $$(A,B,C)DO_3, \tag{P1}$$

where each of A, B, C, and D represents one or more metal elements, A, B, and C represent A-site elements, D represents one or more B-site elements, O represents the oxygen element, and the A-site elements A, B, and C are different.

In this case, it is preferable that the perovskite oxide (A, B, C)$DO_3$ satisfy the conditions expressed by the following inequalities (1a) to (4a), and it is particularly preferable that the perovskite oxide (A, B, C)$DO_3$ further satisfy the condition expressed by the following inequalities (5a).

$$0.98 \leq TF(P1) \leq 1.01 \tag{1a}$$

$$TF(ADO_3) > 1.0 \tag{2a}$$

$$TF(BDO_3) < 1.0 \tag{3a}$$

$$TF(BDO_3) < TF(CDO_3) < TF(ADO_3) \tag{4a}$$

$$0.98 \leq TF(CDO_3) \leq 1.02 \tag{5a}$$

In the inequalities (1a), the tolerance factor of the perovskite oxide (A, B, C)$DO_3$ is expressed as TF(P1).

Further, in the case where all of the A-site elements A, B, and C are identical, the compositional formula (A, B, C) (D, E, F)$O_3$ can be expressed as $$A(D,E,F)O_3, \tag{P2}$$

where each of A, D, E, and F represents one or more metal elements, A represents one or more A-site elements, D, E, and F represent B-site elements, O represents the oxygen element, and the B-site elements D, E, and F are different.

In this case, it is preferable that the perovskite oxide A (D, E, F)$O_3$ satisfy the conditions expressed by the following inequalities (1b) to (4b), and it is particularly preferable that the perovskite oxide A(D, E, F)$O_3$ further satisfy the condition expressed by the following inequalities (5b).

$$0.98 \leq TF(P2) \leq 1.01 \tag{1b}$$

$$TF(ADO_3) > 1.0 \tag{2b}$$

$$TF(AEO_3) < 1.0 \tag{3b}$$

$$TF(AEO_3) < TF(AFO_3) < TF(ADO_3) \tag{4b}$$

$$0.98 \leq TF(AFO_3) \leq 1.02 \tag{5b}$$

In the inequalities (1b), the tolerance factor of the perovskite oxide A(D, E, F)$O_3$ is expressed as TF(P2).

FIG. 1 is a diagram indicating the tolerance factors TF and the crystal systems of various perovskite oxides in association with the average ionic radii of the A-site elements and the B-site elements, where ions of one or two elements reside in the A sites of the perovskite oxides, and ions of one or two elements reside in the B sites of the perovskite oxides.

In FIG. 1, C denotes the cubic crystal, M denotes the monoclinic crystal, PC denotes the pseudocubic crystal, R denotes the rhombohedral crystal, T denotes a tetragonal crystal, and Tr denotes the trigonal crystal. In addition, the ionic radii of various elements are indicated in association with the symbols for the respective elements. In particular, both of the ionic radius "0.64 (angstroms)" of the trivalent Mn ion and the ionic radius "0.67 (angstroms)" of the divalent Mn ion are indicated in FIG. 1.

When the tolerance factor TF is equal to 1.0, the crystal lattice of the perovskite structure has the closest packed structure. Since the B-site ions hardly move in the crystal lattice under this condition, the perovskite oxide is likely to have a stable structure. When the perovskite oxide has such a composition as to realize the above condition, the perovskite oxide is likely to have a crystal structure such as the cubic or pseudocubic crystal structure, and does not exhibit ferroelectricity, or exhibits very low ferroelectricity.

When the tolerance factor TF is greater than 1.0, the B-site ions are smaller than the A-site ions. Under this condition, the B-site ions are likely to enter the crystal lattice even when the crystal lattice is distorted, and to move in the crystal lattice. When the perovskite oxide has such a composition as to realize the above condition, the perovskite oxide is likely to have a crystal structure such as the tetragonal crystal (in which the spontaneous polarization axis is orientated along the <001> direction), and exhibits ferroelectricity. There is a tendency that the ferroelectricity becomes higher when the difference of the tolerance factor from 1.0 increases.

When the tolerance factor TF is smaller than 1.0, the B-site ions are greater than the A-site ions. Under this condition, the B-site ions do not enter the crystal lattice unless the crystal lattice is distorted. When the perovskite oxide has such a composition as to realize the above condition, the perovskite oxide is likely to have a crystal structure such as the orthorhombic crystal (in which the spontaneous polarization axis is orientated along the <110> direction) or the rhombohedral crystal (in which the spontaneous polarization axis is orientated along the <111> direction), and exhibits ferroelectricity. There is a tendency that the ferroelectricity becomes higher when the difference of the tolerance factor from 1.0 increases.

Table 1 shows first and second components constituting each of various mixed crystals and the mole fractions of the first and second components which realize an morphotropic phase boundary (MPB) in each mixed crystal, where the tolerance factor TF of the first component is greater than one, and the tolerance factor TF of the second component is smaller than one. Table 1 also shows the average ionic radii of the A-site and B-site ions in each mixed crystal, the tolerance factor TF of each mixed crystal, the crystal system of the monocrystal formed by each of the first and second components, the ionic radii of the A-site and B-site ions in the monocrystal, and the tolerance factor TF of the monocrystal.

In Table 1, the tetragonal crystal, the orthorhombic crystal, and the rhombohedral crystal are respectively indicated by T, O, and R.

As understood from Table 1, the tolerance factors TF of the MPB compositions of the mixed crystals fall within the range of 0.98 to 1.01. Since the composition of the perovskite oxide according to the present invention is determined to satisfy the inequalities (1), the composition of the perovskite oxide according to the present invention is at or near the MPB.

TABLE 1

| | | TF > 1 | | | | | TF < 1 | | | | MPB | | |
|---|---|---|---|---|---|---|---|---|---|---|---|---|---|
| | | Crystal System | Radius of A ion | Radius of B ion | TF | Fraction | | Crystal System | Radius of A ion | Radius of B ion | TF | Fraction | Radius of A ion | Radius of B ion | TF |
| PT-PZ | PbTiO$_3$ | T | 1.49 | 0.61 | 1.017 | 0.48 | PbZrO$_3$ | R | 1.49 | 0.72 | 0.964 | 0.52 | 1.49 | 0.67 | 0.989 |
| PT-PS | PbTiO$_3$ | T | 1.49 | 0.61 | 1.017 | 0.45 | PbSnO$_3$ | R | 1.49 | 0.69 | 0.978 | 0.55 | 1.49 | 0.65 | 0.995 |
| PT-BiF | PbTiO$_3$ | T | 1.49 | 0.61 | 1.017 | 0.3 | BiFeO$_3$ | R | 1.37 | 0.55 | 1.005 | 0.7 | 1.41 | 0.57 | 1.008 |
| BT-BiNT | BT | T | 1.61 | 0.61 | 1.059 | 0.15 | (Bi, Na)TiO$_3$ | R | 1.38 | 0.61 | 0.978 | 0.85 | 1.41 | 0.61 | 0.990 |
| BT-BiNT | BT | T | 1.61 | 0.61 | 1.059 | 0.07 | (Bi, Na)TiO$_3$ | R | 1.38 | 0.61 | 0.978 | 0.93 | 1.40 | 0.61 | 0.984 |
| BT-BiNT | (Bi, K)TiO$_3$ | T | 1.51 | 0.61 | 1.024 | 0.2 | (Bi, Na)TiO$_3$ | R | 1.38 | 0.61 | 0.978 | 0.8 | 1.41 | 0.61 | 0.987 |
| KNN | KNbO$_3$ | O | 1.64 | 0.64 | 1.054 | 0.49 | NaNbO$_3$ | O | 1.39 | 0.64 | 0.967 | 0.51 | 1.51 | 0.64 | 1.010 |

For example, it is possible to design a perovskite oxide satisfying the conditions (1) to (4) (preferably, the conditions (1) to (5)) by first selecting a first material having the composition ADO$_3$ and a tolerance factor TF greater than 1.0 as the first component and a second material having the composition BEO$_3$ and a tolerance factor TF smaller than 1.0 as the second component, and then appropriately determining the additive elements C and F so that the tolerance factor TF of the perovskite oxide (A, B, C) (D, E, F)O$_3$ is in the range of 0.98 to 1.01.

In the above design, the first component ADO$_3$ having a tolerance factor TF greater than 1.0 (i.e., exhibiting high-ferroelectricity) and the second component BEO$_3$ having a tolerance factor TF smaller than 1.0 (i.e., exhibiting high ferroelectricity) are selected, and the additive elements C and F are determined so that the composition of the perovskite oxide (A, B, C) (D, E, F)O$_3$ is at or near the MPB. When the tolerance factor TF of the third component CFO$_3$ is near 1.0 (preferably, in the range of 0.98 to 1.02) and the ferroelectricity of the third component CFO$_3$ is low, it is possible to design a perovskite oxide satisfying the conditions (1) to (4) (preferably, the conditions (1) to (5)).

From the viewpoint of the piezoelectric (ferroelectric) performance of the perovskite oxide (A, B, C) (D, E, F)O$_3$ designed according to the present invention, it is more preferable that the ferroelectricity of the first component ADO$_3$ and the second component BEO$_3$ be higher. That is, it is more preferable that the tolerance factor TF of each of the first component ADO$_3$ and the second component BEO$_3$ more greatly differ from 1.0.

Specifically, it is possible to bring the tolerance factor TF of the perovskite oxide (A, B, C) (D, E, F)O$_3$ into the range of 0.98 to 1.01 by selecting PT (PbTiO$_3$, which has the tolerance factor TF greater than 1.0) and PZ (PbZrO$_3$, which has the tolerance factor TF smaller than 1.0) on the basis of the diagram of FIG. 1, and then adding, for example, niobium or the like as B-site ions. According to the diagram of FIG. 1, the ionic radii of the A-site ions in PbNbO$_3$, PT, and PZ are identical, and the tolerance factor TF of PbNbO$_3$ is between PT and PZ. Therefore, it is possible to bring the tolerance factor TF of the perovskite oxide (A, B, C) (D, E, F)O$_3$ into the range of 0.98 to 1.01 by adding niobium to the mixed crystal of PT and PZ. In this case, the composition of the perovskite oxide becomes Pb (Ti, Zr, Nb) $O_3$.

In consideration of the valences of the ions, the crystal formed of only $PbNbO_3$ cannot have a perovskite structure. In the material design according to the present invention, the overall composition of the perovskite oxide is designed by theoretically obtaining the tolerance factor TF of each of the oxides $ADO_3$, $BEO_3$, and $CFO_3$ irrespectively of whether or not the crystal formed of only one of the oxides $ADO_3$, $BEO_3$, and $CFO_3$ can have a perovskite structure.

In the case where PT ($PbTiO_3$, which has the tolerance factor TF greater than 1.0) and PZ ($PbZrO_3$, which has the tolerance factor TF smaller than 1.0) are selected, alternatively, it is also possible to satisfy the conditions (1) to (4) (preferably, the conditions (1) to (5)) by adding as B-site ions other elements each having an ionic radius near to the ionic radius of niobium, such as Sn, Ta, Mo, W, Ir, Os, Pd, Pt, Re, Mn, Co, Ni, V, and Fe.

Further, it is possible to add two or more of Sn, Nb, Ta, Mo, W, Ir, Os, Pd, Pt, Re, Mn, Co, Ni, V, and Fe as B-site ions. That is, the composition of the above example of the perovskite oxide according to the present invention can be expressed by the compositional formula,

$Pb(Ti,Zr,M)O_3$, (PX)

where M in the compound $Pb(Ti, Zr, M)O_3$ is at least one of the metal elements Sn, Nb, Ta, Mo, W, Ir, Os, Pd, Pt, Re, Mn, Co, Ni, V, and Fe.

Alternatively, it is possible to add an element as A-site ions (as the element C in the composition $(A, B, C) (D, E, F)O_3$) to a mixed crystal of PT and PZ, instead of adding an element as the B-site ions (as the element F in the composition $(A, B, C)(D, E, F)O_3$). Further alternatively, it is possible to add both of an element as A-site ions (as the element C in the composition $(A, B, C) (D, E, F)O_3$) and an element as B-site ions (as the element F in the composition $(A, B, C) (D, E, F)O_3$) to a mixed crystal of PT and PZ.

In addition, it is also possible to bring the tolerance factor TF of the perovskite oxide $(A, B, C) (D, E, F)O_3$ into the range of 0.98 to 1.01 by selecting BT ($BaTiO_3$, which has the tolerance factor TF greater than 1.0) and CT ($CaTiO_3$, which has the tolerance factor TF smaller than 1.0) on the basis of the diagram of FIG. 1, and then adding, for example, strontium or the like as A-site ions. In this case, the composition of the perovskite oxide becomes $(Ba, Ca, Sr)TiO_3$.

Further, it is also possible to apply the above manner of designing the A-site ions (Ba, Ca, and Sr) to the aforementioned mixed crystal containing Ti and Zr as B-site ions, and further add the element M as B-site ions to the mixed crystal containing Ti and Zr as B-site ions and Ba, Ca, and Sr as the A-site elements (in a similar manner to the aforementioned manner of designing the B-site elements in $Pb(Ti, Zr, M)O_3$). In this case, the composition of the perovskite oxide can be expressed by the compositional formula, $(Ba,Ca,Sr)(Ti,Zr,M)O_3$, (PY)

where M in the compound $(Ba, Ca, Sr) (Ti, Zr, M)O_3$ is at least one of the metal elements Sn, Nb, Ta, Mo, W, Ir, Os, Pd, Pt, Re, Mn, Co, Ni, V, and Fe.

Furthermore, it is also possible to bring the tolerance factor TF of the perovskite oxide $(A, B, C) (D, E, F)O_3$ into the range of 0.98 to 1.01 by selecting BA ($BiAlO_3$, which has the tolerance factor TF greater than 1.0) as the first component $ADO_3$ and BF ($BiFeO_3$, which has the tolerance factor TF smaller than 1.0) as the second component $BEO_3$ on the basis of the diagram of FIG. 1, and then adding, for example, strontium or the like as B-site ions. In this case, since TF(B- i$FeO_3$)=0.960 and TF($BiScO_3$)=0.911 as indicated in FIG. 1, TF($BiScO_3$)<TF($BiFeO_3$), and $BiScO_3$ does not satisfy the inequalities (5). However, it is possible to bring the tolerance factor TF of the perovskite oxide Bi(Al, Fe, Sc)$O_3$ into the range of 0.98 to 1.01 by appropriately adjusting the composition. (For example, the tolerance factor TF of $Bi(Al_{0.6}Fe_{0.35}Sc_{0.05})O_3$ is 0.989.) The perovskite oxide Bi(Al, Fe, M)$O_3$ can also satisfy the inequalities (1) to (4) (and the inequalities (5) in preferable cases) in the case where the element M added as B-site ions in the perovskite oxide Bi(Al, Fe, M)$O_3$ is an element (such as Cr, Mn, Co, Ni, or Ga) having an ionic radius near to the ionic radius of scandium. Thus, the composition of the perovskite oxide can be expressed by the compositional formula,

$Bi(Al,Fe,M)O_3$, (PW)

where M in the compound Bi(Al, Fe, M)$O_3$ is at least one of the metal elements Cr, Mn, Co, Ni, Ga, and Sc.

According to the present invention, the tolerance factor of each of the oxides $(A, B, C) (D, E, F)O_3$, $ADO_3$, $BEO_3$, and $CFO_3$ is theoretically obtained, and then the composition of the perovskite oxide $(A, B, C) (D, E, F)O_3$ is determined. At this time, even when one or more of the oxides do not form a perovskite structure by themselves, the tolerance factor of each of the oxides is theoretically obtained, and then the composition of the perovskite oxide $(A, B, C) (D, E, F)O_3$ is obtained so as to satisfy the conditions (1) to (4) (preferably, the conditions (1) to (5)). The perovskite oxides designed in accordance with the material design principle as above have composition at or near the MPB, and therefore exhibit high piezoelectric (ferroelectric) performance.

As explained in the "SUMMARY OF THE INVENTION," the phase structure of the perovskite oxide is not specifically limited. For example, the perovskite oxide may have a three-phase mixed-crystal structure in which the three components $ADO_3$, $BEO_3$, and $CFO_3$ coexist, or a single-phase structure in which the three components $ADO_3$, $BEO_3$, and $CFO_3$ are completely solid solved into a single phase, or another structure.

It is preferable that the perovskite oxide according to the present invention contain the first component $ADO_3$ having the tolerance factor TF greater than 1.0, the second component $BEO_3$ having the tolerance factor TF smaller than 1.0, and the third component $CFO_3$ having the tolerance factor TF near to 1.0. As mentioned before, in each of the first component $ADO_3$, the second component $BEO_3$, and the third component $CFO_3$, the ratio of each of the molar amount of the A-site element and the molar amount of the B-site element to the molar amount of oxygen atoms is normally 1:3. However, the ratio of each of the molar amount of the A-site element and the molar amount of the B-site element to the molar amount of oxygen atoms may deviate from 1:3 within a range in which each of the first component $ADO_3$, the second component $BEO_3$, and the third component $CFO_3$ can form a perovskite structure.

It is also preferable that the first component $ADO_3$ and the second component $BEO_3$ form structures respectively corresponding to different crystal systems, and particularly preferable that the first component $ADO_3$, the second component $BEO_3$, and the third component $CFO_3$ form structures respectively corresponding to different crystal systems.

In a preferable example of the perovskite oxide, the crystal system of the first component $ADO_3$ is one of the tetragonal, orthorhombic, monoclinic, trigonal, and rhombohedral systems, the crystal system of the second component $BEO_3$ is one of the tetragonal, orthorhombic, and rhombohedral sys-

tems which is different from the first component $ADO_3$, and the third component $CFO_3$ is one of the cubic and pseudocubic systems.

When a perovskite oxide is designed according to the present invention, it is possible to produce the perovskite oxide having a composition at or near the MPB and a mixed-crystal structure composed of at least two crystal phases selected from the tetragonal, orthorhombic, and rhombohedral phases and at least one crystal phase selected from the cubic and pseudocubic phases.

In addition, when a perovskite oxide is designed according to the present invention, it is also possible to produce the perovskite oxide having a composition at or near the MPB, and exhibiting a first diffraction peak of a tetragonal phase, a second diffraction peak of a rhombohedral phase, and a third diffraction peak different from the first and second diffraction peaks in a high-resolution X-ray diffraction (XRD) profile.

The present inventor has performed measurement of high-resolution XRD, and confirmed that the Nb-doped PZT (Nb-PZT) having composition at or near the MPB can form a three-phase mixed-crystal structure in which the tetragonal and rhombohedral phases and a third phase different from the tetragonal and rhombohedral phases coexist (as explained later as the concrete example 1 with reference to FIG. 9A). Nb-PZT is one of the oxides which can be expressed by the compositional formula Pb (Ti, Zr, M)$O_3$, and is a perovskite oxide which satisfies the aforementioned conditions (1) to (5). On the other hand, no diffraction peak corresponding to the third phase has been found in undoped PZT having composition at or near the MPB (as explained later as the comparison example 1 with reference to FIG. 9B).

The present inventor has confirmed the fact that the tolerance factor TF of the third component is near to 1.0, and the lattice constant of the phase of the third component obtained from the corresponding diffraction peak in the high-resolution XRD coincides with the lattice constant which is expected when the phase of the third component is assumed to be the cubic or pseudocubic phase. The present inventor conjectures that the third phase is a cubic or pseudocubic phase, on the basis of the above fact and a result of EXAFS (Extended X-ray Absorption Fine Structure) measurement (as explained later as the concrete example 1 with reference to FIG. 9A and Table 2).

The present inventor has confirmed that the perovskite oxide according to the present invention having a three-phase mixed-crystal structure is a material which exhibits high piezoelectric performance, and can be effectively used in the system utilizing phase transition induced by an electric field as proposed in WO2007/034903.

2. Characteristics of Piezoelectric Body

Hereinbelow, the system utilizing phase transition induced by an electric field as proposed in WO2007/034903 is explained. This system includes a piezoelectric body having a first ferroelectric phase which forms a structure in a first crystal system. When an electric field is applied to the piezoelectric body, at least a portion of the first ferroelectric phase transitions to a second ferroelectric phase which forms a structure in a second crystal system different from the first crystal system.

Figure 2:
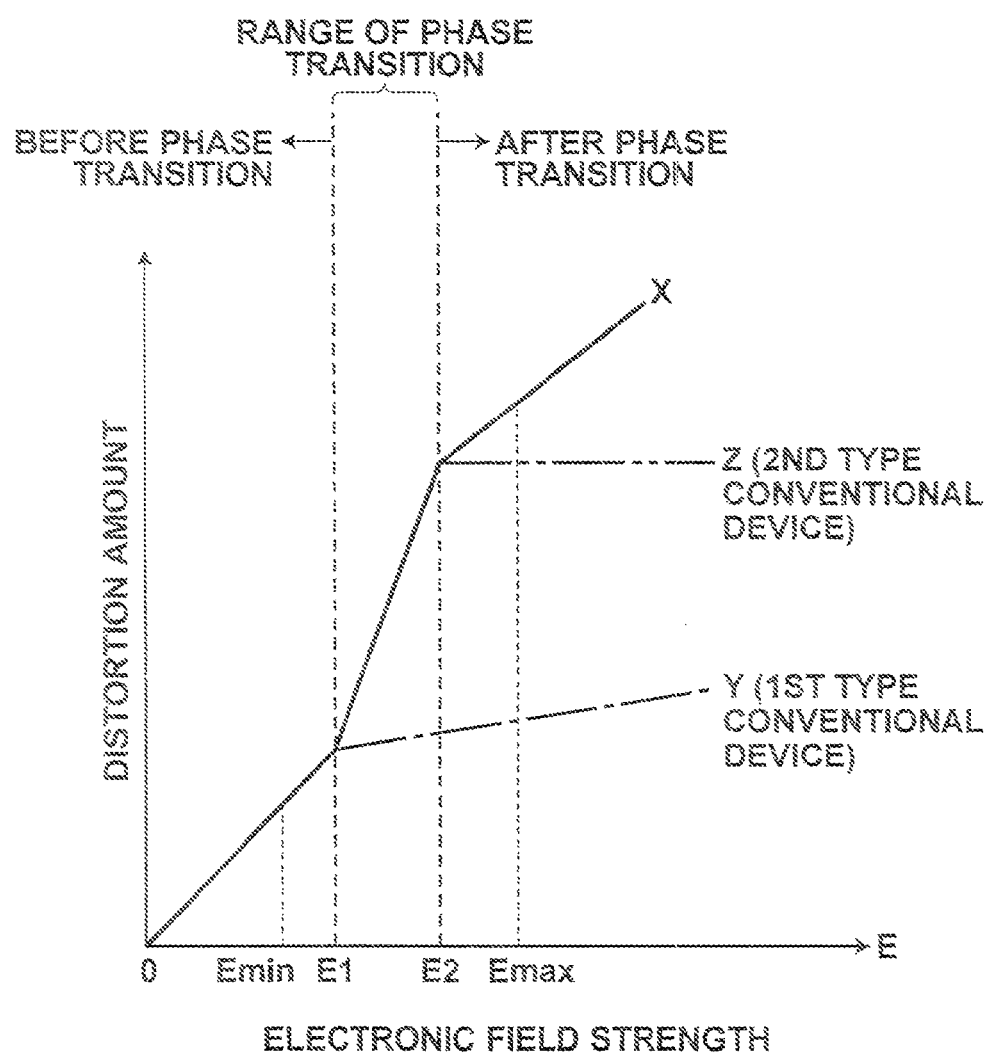
FIG. 2 is a diagram schematically indicating a piezoelectric characteristic of a piezoelectric body which is entirely composed of a first ferroelectric phase, and transitions to a second ferroelectric phase when an electric field is applied to the piezoelectric body, where the first and the second ferroelectric phases correspond to different crystal systems.

First, the piezoelectric characteristic of the above piezoelectric body is explained below, where it is assumed, for simple explanation, that the entire piezoelectric body is initially in the first ferroelectric phase, which transitions to the second ferroelectric phase when an electric field is applied to the piezoelectric body, and the structures in the first and second ferroelectric phases correspond to different crystal systems. FIG. 2 schematically indicates, by the thick solid polygonal line X, a relationship between the strength of the electric field and the distortion amount in the piezoelectric body.

In FIG. 2, E1 is the minimum electric field strength at which the phase transition from the above first ferroelectric phase begins, and E2 is the electric field strength at which the phase transition is substantially completed. The "electric field strength at which the phase transition is substantially completed" is such a level of the electric field strength that the phase transition no longer occurs even when the electric field strength becomes higher than the level. In some cases, even when the electric field strength becomes higher than E2, the phase transition does not occur in a portion of the first ferroelectric phase, so that the portion in the first ferroelectric phase remains.

In the first range of the electric field strength E of 0 to E1, the distortion amount of the piezoelectric body linearly increases with increase in the electric field strength because of the piezoelectric effect in the first ferroelectric phase (before the phase transition). In the second range of the electric field strength E of E1 to E2, the distortion amount of the piezoelectric body still linearly increases with increase in the electric field strength because the change in the crystal structure associated with the phase transition causes a volume change in the piezoelectric body. In the third range of the electric field strength E greater than E2, the distortion amount of the piezoelectric body further linearly increases with increase in the electric field strength because of the piezoelectric effect in the second ferroelectric phase (after the phase transition).

As explained above, a change in the crystal structure associated with phase transition causes a volume change in the piezoelectric body, and the piezoelectric effect in the ferroelectric material works both before and after the phase transition since the piezoelectric body is in a ferroelectric phase both before and after the phase transition. Therefore, the piezoelectric body according to the present invention can achieve great distortion in each of the first range of 0 to E1, the second range of E1 to E2, and the third range greater than E2.

Further, FIG. 2 also schematically indicates the piezoelectric characteristic of the piezoelectric body in the first type of conventional piezoelectric devices as disclosed in JP2006-036578, and the piezoelectric characteristic of the piezoelectric body in the second type of conventional piezoelectric devices as disclosed in JP3568107. Specifically, the piezoelectric characteristic of the piezoelectric body in the first type of conventional piezoelectric devices is basically the same as the piezoelectric characteristic of the piezoelectric body in the piezoelectric device as proposed in WO2007/034903 in the first range of the electric field strength ($0 \leq E \leq E1$), and different from the piezoelectric characteristic of the piezoelectric body in the piezoelectric device as proposed in WO2007/034903 in the second and third ranges of the electric field strength ($E1 \leq E$), and the portion of the piezoelectric characteristic of the piezoelectric body in the first type of conventional piezoelectric devices in the second and third ranges of the electric field strength ($E1 \leq E$) is indicated by the thick one-dot chain line Y. In addition, the piezoelectric characteristic of the piezoelectric body in the second type of conventional piezoelectric devices is basically the same as the piezoelectric characteristic of the piezoelectric body in the piezoelectric device as proposed in WO2007/034903 in the first and second ranges of the electric field strength ($0 \leq E \leq E2$), and different from the piezoelectric characteristic of the piezoelectric body in the piezoelectric device as proposed in WO2007/034903 in the second and third ranges of the electric field strength (E2≦E), and the portion of the piezoelectric characteristic of the piezoelectric body in the second type of conventional piezoelectric devices in the third range of the electric field strength (E2≦E) is indicated by the thick two-dot chain solid line Z.

As mentioned before in the "Description of the Related Art", in the aforementioned first type of conventional piezoelectric devices, the piezoelectric effect of expansion in the direction of the spontaneous polarization is generally utilized by applying an electric field to a ferroelectric body along the direction of the spontaneous polarization. That is, in the first type of conventional piezoelectric devices, the distortion amount of the piezoelectric body linearly increases with increase in the electric field strength until the electric field strength reaches a predetermined level. However, when the electric field strength exceeds the predetermined level, the amount of increase in the distortion is substantially reduced and the distortion amount is almost saturated.

In addition, as mentioned before in the "Description of the Related Art", JP3568107 discloses substantially only the piezoelectric body utilizing the phase transition between a ferroelectric phase and a paraelectric phase. In the piezoelectric devices disclosed in JP3568107, the distortion amount of the piezoelectric body linearly increases with increase in the electric field strength because of the piezoelectric effect in the first ferroelectric phase (before the phase transition) until the electric field strength reaches a level at which the phase transition begins (as the electric field strength E1 in FIG. 2). Then, the distortion amount of the piezoelectric body further linearly increases with increase in the electric field strength because the change in the crystal structure associated with the phase transition causes the volume change in the piezoelectric body until the electric field strength reaches a level at which the phase transition is substantially completed (as the electric field strength E2 in FIG. 2). However, when the electric field strength exceeds the level at which the phase transition is substantially completed (as the electric field strength E2 in FIG. 2), the piezoelectric effect does not work, so that the distortion amount does not further increase.

On the other hand, the piezoelectric body in which a first ferroelectric phase corresponding to a first crystal system transitions to a second ferroelectric phase corresponding to a second crystal system when an electric field is applied to the piezoelectric body can achieve greater distortion amount than the piezoelectric bodies in the aforementioned first and second types of conventional piezoelectric devices. Although no specific condition is imposed on the activation of the piezoelectric body, in consideration of the distortion amount, it is preferable to activate the piezoelectric body so that the minimum electric field strength Emin and the maximum electric field strength Emax satisfy the condition expressed by the inequalities (6).

$$E\text{min} < E1 < E\text{max} \qquad (6)$$

In addition, it is particularly preferable to activate the piezoelectric body so that the minimum electric field strength Emin and the maximum electric field strength Emax satisfy the condition expressed by the inequalities (7).

$$E\text{min} < E1 < E2 < E\text{max} \qquad (7)$$

Further, it is preferable that the ferroelectric phase in which the phase transition occurs have crystal orientation along a direction different from the orientation of the spontaneous polarization, and it is more preferable that the ferroelectric phase after the phase transition has crystal orientation along a direction approximately identical to the orientation of the spontaneous polarization axis after the phase transition. Normally, the crystal orientation is equal to the direction of the applied electric field. It is particularly preferable to approximately equalize the direction of the applied electric field with the orientation of the spontaneous polarization axis after the phase transition, since in this case the engineered-domain effect can work before the phase transition and make the distortion amount before the phase transition greater than the distortion amount achieved by equalizing the direction of the applied electric field with the orientation of the spontaneous polarization axis before the phase transition. The engineered-domain effect in a monocrystal is explained by S. E. Park et al., "Ultrahigh strain and piezoelectric behavior in relaxor based ferroelectric single crystals", Journal of Applied Physics, Vol. 82, pp. 1804-1811, 1997.

Furthermore, the phase transition can readily occur when the direction of the applied electric field is approximately equal to the orientation of the spontaneous polarization axis after the phase transition. The present inventor considers that since the state in which the direction of the applied electric field is equal to the orientation of the spontaneous polarization axis is crystallographically stable, transition to the more stable state can readily occur. In some cases, phase transition does not occur in a portion of the ferroelectric phase even when the electric field higher than the electric field strength E2 is applied to the piezoelectric body. However, when the phase transition can readily occur, it is possible to reduce the portion the ferroelectric phase in which the phase transition does not occur even when the electric field higher than the electric field strength E2 is applied to the piezoelectric body. Therefore, in the case where the direction of the applied electric field is approximately equal to the orientation of the spontaneous polarization axis after the phase transition, it is possible to stably achieve greater distortion than in the case where the direction of the applied electric field is equal to the orientation of the spontaneous polarization axis before the phase transition.

Moreover, since the direction of the applied electric field is approximately equal to the orientation of the spontaneous polarization axis after the phase transition, the piezoelectric effect effectively works in the ferroelectric phase after the phase transition, so that it is possible to stably achieve great distortion.

As explained above, in the case where the direction of the applied electric field is approximately equal to the orientation of the spontaneous polarization axis after the phase transition, it is possible to achieve great distortion before, during, and after the phase transition. This effect works at least when the direction of the applied electric field is different from the orientation of the spontaneous polarization axis before the phase transition, and becomes more prominent when the direction of the applied electric field approaches the orientation of the spontaneous polarization axis after the phase transition.

In the above explanations, the piezoelectric body is assumed to have a single-phase structure containing only a single first ferroelectric phase corresponding to a first crystal system which transitions to a second ferroelectric phase corresponding to a second crystal system different from the first crystal system when an electric field is applied to the piezoelectric body. However, the above explanations can also be applied to piezoelectric bodies which have a mixed-crystal structure containing a ferroelectric phase corresponding to a crystal system which transitions to another ferroelectric phase corresponding to a different crystal system when an electric field is applied to the piezoelectric body.

3. Phase-Transition Model 1

The present inventor has found that the perovskite oxide according to the present invention having a three-phase mixed-crystal structure composed of the first component $ADO_3$, the second component $BEO_3$, and the third component $CFO_3$ can be effectively used in the aforementioned system utilizing phase transition induced by application of an electric field. Hereinbelow, a model of phase transition in the three-phase mixed-crystal structure is explained as a phase transition model 1 with reference to FIGS. 3A, 3B, and 3C, which illustrate exemplary states of the three-phase mixed-crystal structure constituted by domains corresponding to three crystal systems in the phase transition model 1. In the phase transition model 1, the first component forms a tetragonal crystal (T), the second component forms a rhombohedral crystal (R), and the third component forms a pseudocubic crystal (PC).

Although the ferroelectric phase of one or each of the first and second components can transition to a different ferroelectric phase corresponding to a different crystal system, a case where the phase of the second component transitions from the rhombohedral phase (R) to a tetragonal phase (T) is taken as an example in the following explanation. In addition, in the following example, the ferroelectric phase of the first component has crystal orientation along the orientation of the spontaneous polarization axis (i.e., the electric field is applied along the orientation of the spontaneous polarization axis of the ferroelectric phase of the first component), and the ferroelectric phase of the second component has crystal orientation approximately along the orientation of the spontaneous polarization axis after the phase transition (i.e., the orientation of the applied electric field is approximately identical to the orientation of the spontaneous polarization axis of the ferroelectric phase of the second component after the phase transition). In FIGS. 3A, 3B, and 3C, the arrowed solid lines indicate the directions of the polarizations in the respective domains, and the hollow arrows bearing the reference "E" indicate the direction and the electric field strengths of the applied electric field.

As indicated in FIG. 3A, when no electric field is applied to a piezoelectric body of the perovskite oxide having the above three-phase mixed-crystal structure (i.e., when E=0), the tetragonal domains D1 of the first component and the rhombohedral domains D2 of the second component exhibit ferroelectricity, while the pseudocubic domains D3 of the third component do not exhibit ferroelectricity.

The present inventor considers that when the electric field E at a low electric field strength not exceeding the aforementioned minimum electric field strength E1 (at which the phase transition of the ferroelectric domains begins) is applied to the piezoelectric as illustrated in FIG. 3B, first, the pseudocubic domains D3 of the third component transition to ferroelectric domains having spontaneous polarization axes along the direction of the applied electric field. In the example illustrated in FIG. 3B, the entire pseudocubic domains D3 of the third component transition to tetragonal domains (T). However, in some cases, a portion of the pseudocubic domains D3 may not transition, and may remain pseudocubic.

The present inventor considers that the displacement in the pseudocubic domains D3 of the third component caused by the transition of the domains D3 induces and facilitates transition of the tetragonal domains D1 of the first component and the domains D2 of the second component (which abut the domains D3).

In the rhombohedral domains D2 of the second component in which TF<1.0, the B-site ions are greater than the A-site ions, so that the B-site ions cannot easily move. On the other hand, in the tetragonal domains D1 of the first component in which TF>1.0, the B-site ions are smaller than the A-site ions, so that the B-site ions can relatively easily move. Therefore, the present inventor considers that the displacement in the domains D3 of the third component caused by the transition of the domains D3 induces the transition of the tetragonal domains D1 of the first component more than the transition of the rhombohedral domains D2 of the second component at the low electric field strength, and therefore the domains D1 can expand along the orientation of the spontaneous polarization axis more easily than the domains D2.

The present inventor also considers that when the electric field strength is further increased, the displacement in the pseudocubic domains D3 of the third component caused by the transition of the domains D3 and/or the displacement in the tetragonal domains D1 of the first component caused by the transition of the domains D1 induce and facilitate transition of the rhombohedral domains D2 of the second component to the tetragonal phase (T). FIG. 3C shows a state of the piezoelectric body to which an electric field with the strength E higher than the electric field strength E2 (at which the phase transition of the ferroelectric phases is substantially completed) is applied. Although the entire domains D2 have transitioned to the tetragonal phase (T) in the example illustrated in FIG. 3C, in some cases, a portion of the domains D2 may not transition, and may remain rhombohedral.

Figure 4A:
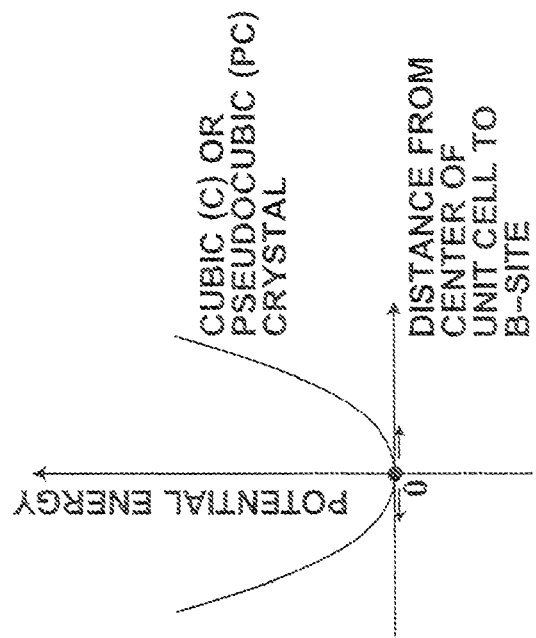
FIG. 4A is a diagram schematically indicating the relationship between the potential energy and the distance from the center to the B-site element in the unit cell of the rhombohedral crystal.
Figure 4B:
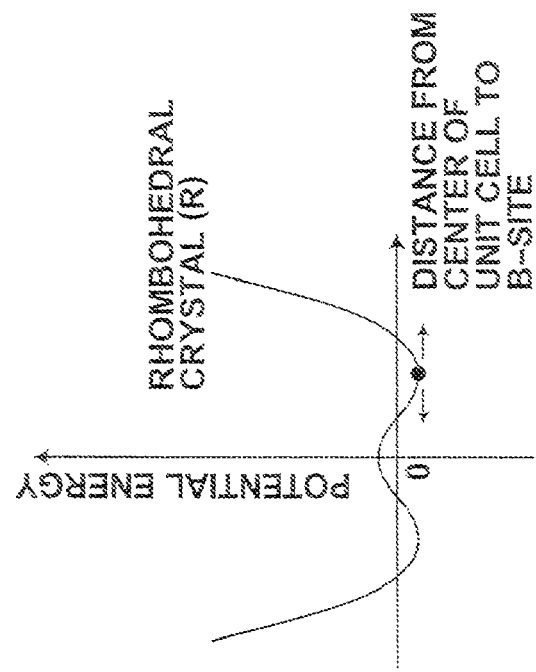
FIG. 4B is a diagram schematically indicating the relationship between the potential energy and the distance from the center to the B-site element in the unit cell of the cubic or pseudocubic crystal.

FIG. 4A is a diagram schematically indicating the relationship between the potential energy and the distance from the center to the B-site element in the unit cell of the rhombohedral crystal, and FIG. 4B is a diagram schematically indicating the relationship between the potential energy and the distance from the center to the B-site element in the unit cell of the cubic or pseudocubic crystal. As indicated in FIG. 4A, the potential energy of the rhombohedral (R) crystal is lowest (i.e., the rhombohedral crystal is most stable) when the B-site ions are at two positions slightly apart from the centers of the unit cells. On the other hand, as indicated in FIG. 4B, the potential energy of the cubic (C) or pseudocubic (PC) crystal is lowest (i.e., the cubic or pseudocubic crystal is most stable) when the B-site ions are at the centers of the unit cells.

In addition, FIG. 4B shows that the slope of the potential energy curve for the cubic (C) or pseudocubic (PC) crystal is relatively gentle when the B-site ions move slightly away from the centers of the unit cells. Therefore, it is possible to consider that the B-site ions in the cubic (C) or pseudocubic (PC) crystal can move relatively easily at relatively low electric field strength, and therefore phase transition can occur relatively easily in the cubic (C) or pseudocubic (PC) crystal. On the other hand, FIG. 4A shows that the slope of the potential energy curve for the rhombohedral (R) crystal is relatively steep when the B-site ions move slightly away from the centers of the unit cells. Therefore, it is possible to consider that the B-site ions in the rhombohedral (R) crystal can move less easily than in the cubic (C) or pseudocubic (PC) crystal, and therefore phase transition can occur less easily in the rhombohedral (R) crystal than in the cubic (C) or pseudocubic (PC) crystal. Nevertheless, the present inventor considers that the existence of the domains D3 of the third component, the phase of which transitions first, facilitates the phase transition in the rhombohedral (R) crystal.

The system in which phase transition is induced by application of an electric field according to the present invention can achieve higher piezoelectric performance than the conventional systems in which no phase transition occurs or only the phase transition from a ferroelectric phase to a paraelectric phase occurs. In addition, the present inventor considers that the existence of the domains D3 of the third component, the phase of which transitions first, facilitates the phase transition in the ferroelectric domains D1 of the first component and the ferroelectric domains D2 of the second component, and therefore higher piezoelectric performance can be achieved even at relatively low electric field strength.

Although the phase of the domains D3 of the third component is considered to transition first as explained above, the domains D3 of the third component are considered to be paraelectric when no electric field is applied to the piezoelectric body. Therefore, the minimum electric field strength E1 (at which the phase transition of the ferroelectric phase begins) is the minimum electric field strength at which the phase transition begins in either of the ferroelectric domains D1 of the first component and the ferroelectric domains D2 of the second component.

As explained later on the basis of the concrete example 2 and the comparison example 2, the present inventor has confirmed that Nb-doped PZT (Nb-PZT) having a three-phase mixed-crystal structure with a composition of PT (as the first component), PZ (as the second component), and $PbNbO_3$ (as the third component) at or near the MPB can realize a high piezoelectric coefficient even at relatively low electric field strength, compared with undoped PZT having a two-phase mixed-crystal structure with a composition of only PT (as the first component) and PZ (as the second component) at or near the MPB.

4. Phase-Transition Model 2

Even in the case where the perovskite oxides designed according to the present invention have a phase structure other than the three-phase mixed-crystal structure, the perovskite oxides can be effectively used in the system utilizing phase transition induced by application of an electric field. The present inventor has produced a film of Nb-doped PZT (Nb-PZT) having a composition at or near the MPB and a phase structure being formed mainly of a rhombohedral phase and containing some tetragonal phase, and has confirmed that the film of Nb-PZT can be effectively used in the system utilizing phase transition induced by application of an electric field, and can have a high piezoelectric coefficient even at relatively low electric field strength, as explained later as the concrete example 3. Hereinbelow, a model of phase transition in the above phase structure is explained as a phase transition model 2 with reference to FIGS. 5A, 5B, and 5C, which illustrate exemplary states of the mixed-crystal structure constituted by domains corresponding to two crystal systems in the phase transition model 2. In the phase transition model 2, the piezoelectric body is composed mainly of a rhombohedral phase (R) when no electric field is applied, and the rhombohedral phase (R) transitions to a tetragonal phase (T) when an electric field is applied. In addition, in the following example, the ferroelectric phase (R) has crystal orientation approximately along the orientation of the spontaneous polarization axis of the tetragonal phase (T) (i.e., the orientation of the applied electric field is approximately identical to the orientation of the spontaneous polarization axis of the ferroelectric phase after the phase transition).

The present inventor considers that the phase transition in the phase transition model 2 progresses as follows.

When no electric field is applied to a piezoelectric body of the perovskite oxide having the above phase structure (i.e., when E=0), the piezoelectric body is formed mainly of a rhombohedral domain (R), and tetragonal nanodomains (T) are formed in the rhombohedral domain (R) as illustrated in FIG. 5A due to the doping with the elements C and F in the compound (A, B, C) (D, E, F)$O_3$.

The above tetragonal nanodomains (T) become the seeds (starting points) of the phase transition. That is, when an electric field with an intermediate strength E equal to or higher than the minimum electric field strength E1 (at which the phase transition of the ferroelectric domain (R) begins) is applied to the piezoelectric body which initially has the phase structure of FIG. 5A, i.e., when $E1 \leq E \leq E2$, the phase transition of the rhombohedral domain (R) develops from the tetragonal nanodomains (T), so that larger tetragonal domains (T) than the nanodomains are formed around the nanodomains as illustrated in FIG. 5B.

Thereafter, when the electric field strength is further increased, the above phase transition to the larger tetragonal domains (T) induces and facilitates displacement in and phase transition of the remaining portion of the ferroelectric domain (R), and resultantly produces great distortion induced by an electric field. FIG. 5C shows a state of the piezoelectric body when an electric field with the strength not lower than the electric field strength E2 (at which the phase transition of the ferroelectric domain (R) is substantially completed) is applied to the piezoelectric body, i.e., when E E2. Although the entire rhombohedral domain (R) has transitioned to the tetragonal phase (T), in some cases, a portion of the rhombohedral domain (R) may not transition, and remain rhombohedral.

As explained above, the present invention presents a novel material design principle for producing a perovskite oxide superior in piezoelectric (ferroelectric) performance. Therefore, according to the present invention, it is possible to easily design the composition of a perovskite oxide at or near the MPB so that the perovskite oxide exhibits superior piezoelectric (ferroelectric) performance.

In particular, the perovskite oxide produced in accordance with the material design principle of the present invention is suitable for use in the system utilizing phase transition induced by application of an electric field as proposed in WO2007/034903. According to the present invention, it is possible to provide a perovskite oxide having a domain structure in which phase transition can readily occur and great distortion can be achieved even at relatively low electric field strength. The feature of achieving great distortion at relatively low electric field strength is preferable for saving energy.

5. Ferroelectric Compound

As described before, the ferroelectric compound according to the present invention is characterized in containing the perovskite oxide the composition of which is designed in accordance with the material design principle according to the present invention. The ferroelectric compound according to the present invention can further contain an arbitrary component other than the perovskite oxide according to the present invention, such as a perovskite oxide other than the perovskite oxide according to the present invention, another dopant, a sintering agent, and the like.

6. Piezoelectric Device and Inkjet Recording Head

As described before, the piezoelectric device according to the present invention is characterized in comprising the piezoelectric body according to the present invention and electrodes for applying an electric field to the piezoelectric body. Since the piezoelectric device according to the present invention uses the perovskite oxide according to the present invention, the piezoelectric device according to the present invention exhibits high piezoelectric performance.

Figure 6:
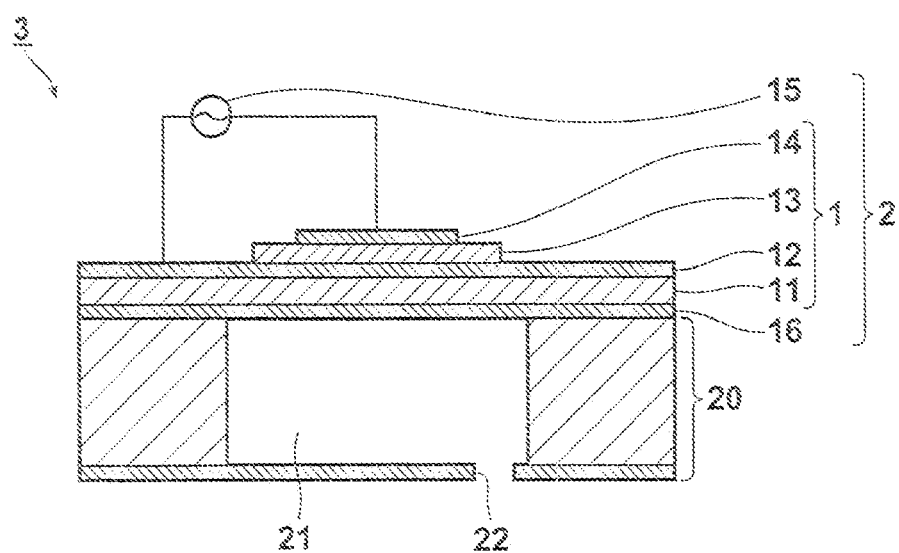
FIG. 6 is a cross-sectional view schematically illustrating a cross section of an essential portion of an inkjet recording head (as a liquid discharge device) having a piezoelectric device according to an embodiment of the present invention.

For example, in the case where the perovskite oxide according to the present invention used in a piezoelectric body in the piezoelectric device has a three-phase mixed-crystal structure composed of the first component $ADO_3$ with the tolerance factor TF greater than 1.0, the second component $BEO_3$ with the tolerance factor TF smaller than 1.0, and the third component $CFO_3$ with the tolerance factor TF near to 1.0, and the ferroelectric phase of one or each of the first and second components transitions to another ferroelectric phase having a different crystal structure in response to application of an electric field to the piezoelectric body, the piezoelectric device exhibits high piezoelectric performance even at relatively low electric field strength. Hereinbelow, the structures of the above piezoelectric device and an inkjet recording head (as a liquid discharge device) using the piezoelectric device are explained with reference to FIG. 6, which schematically shows a cross section of an essential portion of the inkjet recording head containing the above piezoelectric device, where the cross section is parallel to the thickness direction of the piezoelectric device. In FIG. 6, the respective elements are illustrated schematically, and the dimensions of the illustrated elements are different from the dimensions of the elements of actual systems.

As illustrated in FIG. 6, the inkjet recording head 3 contains a piezoelectric actuator 2, which is realized by using the piezoelectric device 1. The piezoelectric device 1 is a device produced by forming on a substrate 11 a lower electrode 12, a piezoelectric body 13, and an upper electrode 14 in this order. The piezoelectric body 13 is a polycrystalline body formed of a perovskite oxide which is designed in accordance with the material design principle according to the present invention as explained before, although the piezoelectric body may contain inevitable impurities.

The material for the substrate 11 is not specifically limited. For example, the substrate 11 may be made of silicon, glass, stainless steel, YSZ (yttrium stabilized zirconia), alumina, sapphire, silicon carbide, or the like. In addition, the substrate 11 may be realized by a laminated substrate such as the SOI (silicon-on-insulator) substrate, which is produced by forming on a surface of a silicon substrate an oxide film of $SiO_2$ and a Si active layer in this order.

In addition, the main component of the lower electrode 12 is not specifically limited, and may be, for example, one or a combination of metals such as Au, Pt, and Ir and metal oxides such as $IrO_2$, $RuO_2$, $LaNiO_3$, and $SrRuO_3$. Further, the main component of the upper electrodes 14 is not specifically limited, and may be, for example, one or a combination of the same materials as the examples of the main component of the lower electrode 12 and other materials (such as Al, Ta, Cr, or Cu) which are generally used in the electrodes in the semiconductor processes. Moreover, the thicknesses of the lower and upper electrodes 12 and 14 are not specifically limited, and are preferably 50 to 500 nm.

The piezoelectric actuator 2 comprises a diaphragm 16 and a controller 15 as well as the piezoelectric device 1. The diaphragm 16 is attached to the back surface of the substrate 11 so that the diaphragm 16 vibrates in correspondence with expansion and contraction of the piezoelectric body 13. The controller 15 includes a driver circuit and the like for driving the piezoelectric device 1.

The inkjet recording head 3 is produced by attaching an ink nozzle 20 to the back surface of the piezoelectric actuator 2. The ink nozzle 20 is a member for reserving and discharging ink, and comprises an ink chamber 21 (as a liquid-reserve chamber) and an ink outlet 22 (as a liquid-discharge outlet). The ink chamber 21 reserves ink, and the ink held in the ink chamber 21 is discharged out of the ink chamber 21 through the ink outlet 22 connected to the ink chamber 21.

In the above inkjet recording head 3, the strength of the electric field applied to the piezoelectric device 1 is increased or decreased so as to expand or contract the piezoelectric element and control the discharge and the discharge amount of the ink.

Alternatively, it is possible to process portions of the substrate 10 into the diaphragm 16 and the ink nozzle 20, instead of attaching the diaphragm 16 and the ink nozzle 20 to the piezoelectric device 1. For example, in the case where the substrate 11 is realized by a laminated substrate such as an SOI substrate, the ink chambers 21 can be formed by etching the corresponding portions of the bottom surface of the substrate 11, and the diaphragm 16 and the other structures of the ink nozzle 20 can be formed by processing the substrate 11 per se.

The form of the piezoelectric body 13 can be designed as appropriate. For example, the piezoelectric body 13 may have the form of a film or a sintered ceramic body. In the field of the inkjet recording heads and the like, techniques for more densely arranging piezoelectric elements (devices) are currently being studied in order to improve image quality. In association with the increase in the density of the arrangement of piezoelectric elements, techniques for reduction in the thicknesses of the piezoelectric devices are also being studied. In order to reduce the thickness of the piezoelectric device, the piezoelectric body 13 is preferably a piezoelectric film, and more preferably a thin piezoelectric film having the thickness of 20 nm or smaller. Since the thin piezoelectric film is required to have a high piezoelectric coefficient, and the perovskite oxide according to the present invention has a high piezoelectric coefficient, the perovskite oxide according to the present invention can be effectively used as the material for the thin piezoelectric film.

According to the present embodiment, the piezoelectric body 13 may have a three-phase mixed-crystal structure composed of the first component $ADO_3$ with the tolerance factor TF greater than 1.0, the second component $BEO_3$ with the tolerance factor TF smaller than 1.0, and the third component $CFO_3$ with the tolerance factor TF near to 1.0, and the ferroelectric phase of one or each of the first and second components transitions to another ferroelectric phase having a different crystal structure in response to application of an electric field to the piezoelectric body.

For example, the piezoelectric body 13 has the composition expressed by the compositional formula (PX) or (PY).

$$Pb(Ti,Zr,M)O_3, \quad (PX)$$

$$(Ba,Ca,Sr)(Ti,Zr,M)O_3, \quad (PY)$$

In the compositional formula (PX) or (PY), M is at least one of the metal elements Sn, Nb, Ta, Mo, W, Ir, Os, Pd, Pt, Re, Mn, Co, Ni, V, and Fe.

According to the present embodiment, preferably, the ferroelectric phase or phases which transition in response to application of the electric field have crystal orientation. More preferably, the crystal orientation of each ferroelectric phase which transitions is along a direction different from the orientation of the spontaneous polarization axis in the ferroelectric phase, and particularly preferably, the crystal orientation is approximately identical to the orientation of the spontaneous polarization axis after the phase transition. According to the present embodiment, the crystal orientation is identical to the direction of the electric field applied to the piezoelectric body.

The spontaneous polarization axis of the ferroelectric material is <001> in the tetragonal system, <110> in the orthorhombic system, and <111> in the rhombohedral system. It is possible to equalize the direction of the electric field applied to the piezoelectric body with the spontaneous polarization axis after the phase transition when the ferroelectric phase of the one or each of the first and second components is one of the rhombohedral phase having crystal orientation along approximately the <100> direction, the rhombohedral phase having crystal orientation along approximately the <110> direction, the tetragonal phase having crystal orientation along approximately the <110> direction, the tetragonal phase having crystal orientation along approximately the <111> direction, the orthorhombic phase having crystal orientation along approximately the <100> direction, and the orthorhombic phase having crystal orientation along approximately the <111> direction.

For example, the piezoelectric body 13 having the crystal orientation may be an orientated film (having single-axis orientation), an epitaxial film (having three-axis orientation), or a grain-oriented, sintered ceramic body. The orientated film can be formed under a condition enabling production of a single-axis oriented crystal, by using one of the known thin-film formation techniques including the vapor-phase techniques and the liquid-phase techniques, where the vapor-phase techniques include sputtering, MOCVD (metal organic chemical vapor deposition), pulsed-laser deposition, and the like, and the liquid-phase techniques include the sol-gel technique, MOD (metal organic decomposition), and the like. For example, the (100) orientation can be realized by using (100)-oriented platinum or the like as the lower electrode. The epitaxial film can be formed by using, in the substrate and the lower electrode, materials which lattice-match well with the piezoelectric film. For example, preferable combinations of the materials for the substrate and the lower electrode are $SrTiO_3/SrRuO_3$, MgO/Pt, and the like. The grain-oriented, sintered ceramic body can be formed by the hot-pressing technique, the sheet technique, the lamination press technique, and the like.

The condition for driving the piezoelectric body 13 by the controller 15 is not specifically limited. However, as explained before with reference to FIG. 2, in consideration of the distortion amount, the piezoelectric body 13 is preferably driven by the controller 15 so that the minimum electric field strength Emin and the maximum electric field strength Emax satisfy the condition expressed by the inequalities (6).

$$E\mathrm{min} < E1 < E\mathrm{max} \quad (6)$$

In addition, it is particularly preferable that the minimum electric field strength Emin and the maximum electric field strength Emax satisfy the condition expressed by the inequalities (7).

$$E\mathrm{min} < E1 < E2 < E\mathrm{max} \quad (7)$$

In the above inequalities (6) and (7), E1 is the minimum electric field strength at which the phase transition of the ferroelectric phase of one or each of the first and second components begins, and E2 is the electric field strength at which the phase transition is substantially completed.

In addition, it is preferable to design the piezoelectric device 1 according to the present embodiment so that the phase transition can be realized basically by only changing the electric field strength. Specifically, it is preferable to determine the composition of the piezoelectric body 13 and the crystal systems between which the phase transition is used in the piezoelectric body 13, so that the phase transition can occur at the environmental temperature of the piezoelectric body 13. However, when necessary, it is possible to adjust the operational temperature of the piezoelectric device 1 so that the phase transition can occur. In any case, in order to efficiently utilize the phase transition, it is preferable to drive the piezoelectric device 1 at or near the phase transition temperature.

Since the piezoelectric device 1 according to the present invention uses the piezoelectric body 13 formed of the perovskite oxide which is designed in accordance with the material design principle according to the present invention, the piezoelectric device 1 can exhibit high piezoelectric performance even at relatively low electric field strength.

7. Inkjet Recording Apparatus

Figure 7:
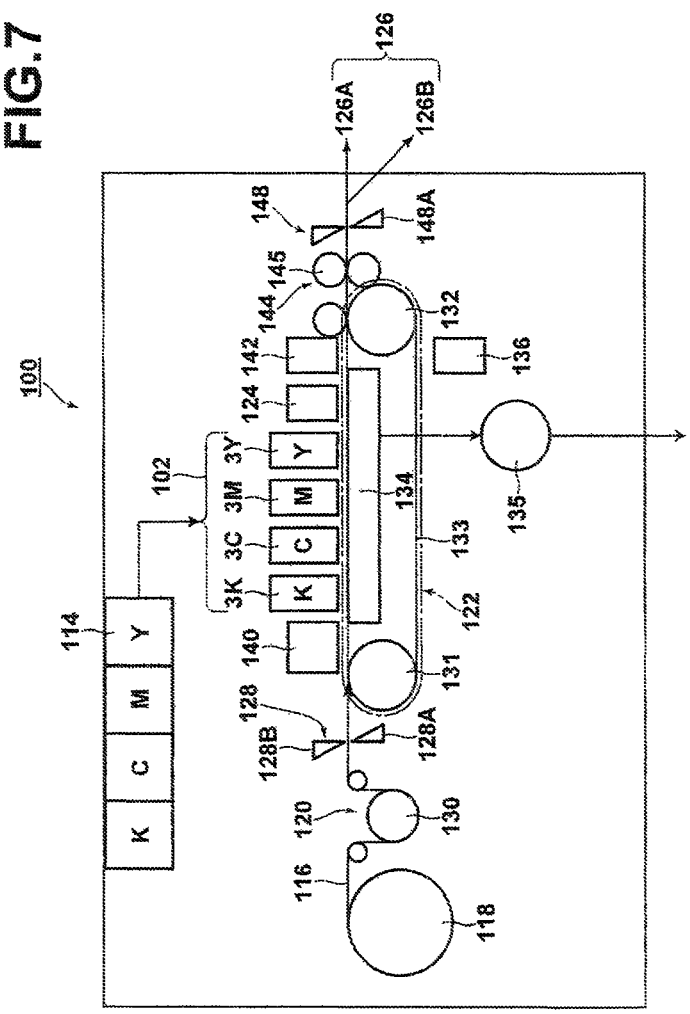
FIG. 7 is a schematic diagram of an example of an inkjet recording apparatus having the inkjet recording head of FIG. 6.
Figure 8:
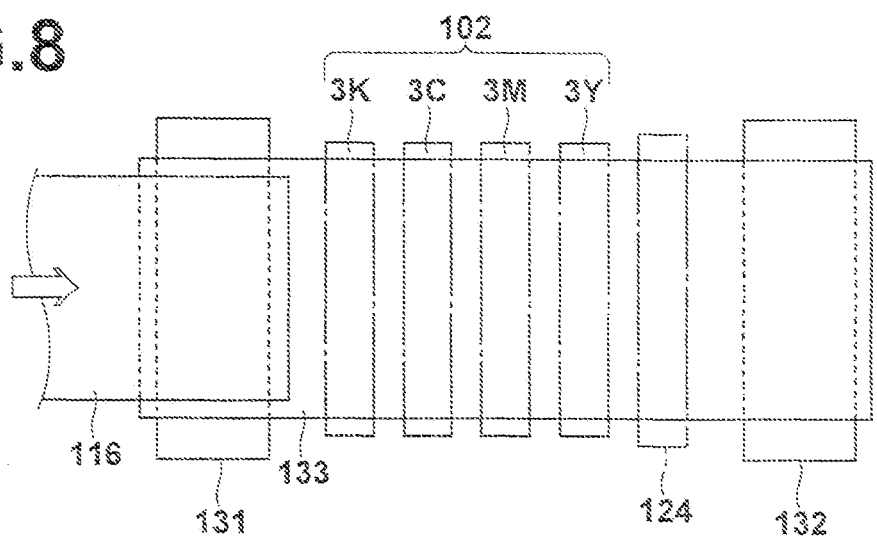
FIG. 8 is a top view of a portion of the inkjet recording apparatus of FIG. 7.

Hereinbelow, an example of an inkjet recording apparatus having the inkjet recording head 3 is explained with reference to FIGS. 7 and 8. FIG. 7 is a schematic diagram illustrating an outline of an example of an inkjet recording apparatus having the inkjet recording head 3 of FIG. 6, and FIG. 8 is a top view of a portion of the inkjet recording apparatus of FIG. 7.

As schematically illustrated in FIG. 7, the inkjet recording apparatus 100 comprises a printing unit 102, an ink reserve-and-load unit 114, a sheet feeding unit 118, a decurling unit 120, a suction-type belt conveyer 122, a print detection unit 124, and a sheet output unit 126. The printing unit 102 comprises a plurality of inkjet recording heads 3K, 3C, 3M, and 3Y corresponding to inks of different colors (specifically, black (K), cyan (C), magenta (M), and yellow (Y)). Hereinafter, the inkjet recording heads may be referred to as heads. The ink reserve-and-load unit 114 reserves the inks to be supplied to the heads 3K, 3C, 3M, and 3Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness of the recording sheet 116. The print detection unit 124 reads an image printed on the recording sheet 116 by the printing unit 102. The sheet output unit 126 externally outputs a printed recording sheet 116.

Each of the heads 3K, 3C, 3M, and 3Y constituting the printing unit 102 corresponds to the inkjet recording head according to the present embodiment as explained before, although, in order to realize a linear head (explained later), each inkjet recording head used in the inkjet recording apparatus 100 comprises a plurality of piezoelectric devices on the lower electrode 12, and a plurality of ink chambers and a plurality of ink outlets are arranged in correspondence with the arrangement of the plurality of piezoelectric devices on the lower electrode 12.

The decurling unit 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120. The cutter 128 is constituted by a fixed blade 128A and a round blade 128B. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor face of the print detection unit 124 are flat and horizontal.

The endless belt 133 has a width greater than the width of the recording sheet 116, and a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and suctioned by a fan 135, so that a negative pressure is generated in the suction chamber 134, and the recording sheet 116 on the endless belt 133 is held by suction.

The power of a motor (not shown) is transmitted to at least one of the rollers 131 and 132 so that the endless belt 133 is driven clockwise in FIG. 7, and the recording sheet 116 held on the endless belt 133 is moved from left to right in FIG. 7.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116 (which is realized by the suction-type belt conveyer 122). The heating fan 140 blows heated air to the recording sheet 116 before printing so as to heat the recording sheet 116 and facilitate drying of deposited ink.

Each of the heads 3K, 3C, 3M, and 3Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 8. Specifically, each of the heads 3K, 3C, 3M, and 3Y is a linear head in which the aforementioned plurality of ink-discharge outlets (nozzles) are arrayed over a length exceeding the maximum length of a side of the largest recording sheet 116 on which the inkjet recording apparatus 100 can print an image. The heads 3K, 3C, 3M, and 3Y corresponding to the inks of the different colors are arrayed upstream in this order along the feeding direction as illustrated in FIG. 8. Thus, a color image can be printed on the recording sheet 116 by discharging the inks of the different colors while conveying the recording sheet 116.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink on the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises a pressure roller 145 with a surface having predetermined projections and depressions, and transfers the predetermined projections and depressions to the printed surface of the recording sheet 116 by pressing the printed surface with the pressure roller 145 while heating the printed surface.

Finally, the printed recording sheet 116 produced as above is outputted from the sheet output unit 126. It is preferable to separately output test prints and prints for practical use. Therefore, the sheet output unit 126 includes a first output unit 126A for the prints for practical use and a second output unit 126B for the test prints. Although not shown, the inkjet recording apparatus 100 further comprises a sorting unit which sorts the printed recording sheets 116 into the test prints and the prints for practical use, and sends the test prints to the first output unit 126B, and the prints for practical use to the second output unit 126A.

Further, in the case where both of a test image and an image for practical use are concurrently printed on a recording sheet 116, it is possible to arrange a cutter 148, and separate a first portion of the recording sheet 116 on which the test image is printed and a second portion of the recording sheet 116 on which the image for practical use is printed.

8. Concrete Examples of the Present Invention

The present inventor has produced concrete examples 1 to 3 of the piezoelectric device according to the present invention and comparison examples 1 and 2 of the conventional piezoelectric devices as indicated below.

8.1 Concrete Example 1

The concrete example 1 of the piezoelectric device according to the present invention is produced as follows.

First, an $SiO_2/Si$ substrate in which the $SiO_2$ layer has a thickness of 0.1 micrometers is prepared. Then, a contact layer of titanium having a thickness of 20 nm is formed on the $SiO_2/Si$ substrate, and a lower electrode of platinum having a thickness of 0.2 micrometers is formed by sputtering. Thereafter, a piezoelectric film of Nb-doped PZT, Pb (Ti, Zr, Nb)$O_3$ (specifically, $PbZr_{0.44}Ti_{0.44}Nb_{0.12}O_3$) having a thickness of 5.0 micrometers is formed by sputtering at the substrate temperature of 525° C. Further, an upper electrode of platinum having a thickness of 0.2 micrometers is formed on the piezoelectric film by sputtering. Thus, a piezoelectric device according to the present invention is obtained.

8.2 Comparison Example 1

The comparison example 1 of the piezoelectric device is produced as follows.

The piezoelectric device as the comparison example 1 is different from the concrete example 1 only in that the piezoelectric film is made of undoped PZT (specifically, $PbZr_{0.44}Ti_{0.48}O_3$).

8.3 Comparison of Concrete Example 1 and Comparison Example 1

The present inventor has performed high-resolution X-ray diffraction (high-resolution XRD) measurement of the piezoelectric film in each of the concrete example 1 and the comparison example 1, and separated peaks in the obtained XRD profiles. FIGS. 9A and 9B respectively show high-resolution XRD profiles of the piezoelectric films in the concrete example 1 and the comparison example 1.

As indicated in FIG. 9B, only a strong (200) diffraction peak of a rhombohedral phase (R) and a weak (200) diffraction peak and a weak (002) diffraction peak of a tetragonal phase (T) are detected in the high-resolution XRD profile of the piezoelectric film in the comparison example 1 (using undoped PZT). That is, it is confirmed that the piezoelectric film in the comparison example 1 has a two-phase mixed-crystal structure composed of the tetragonal phase and the tetragonal phase.

Figure 9A:
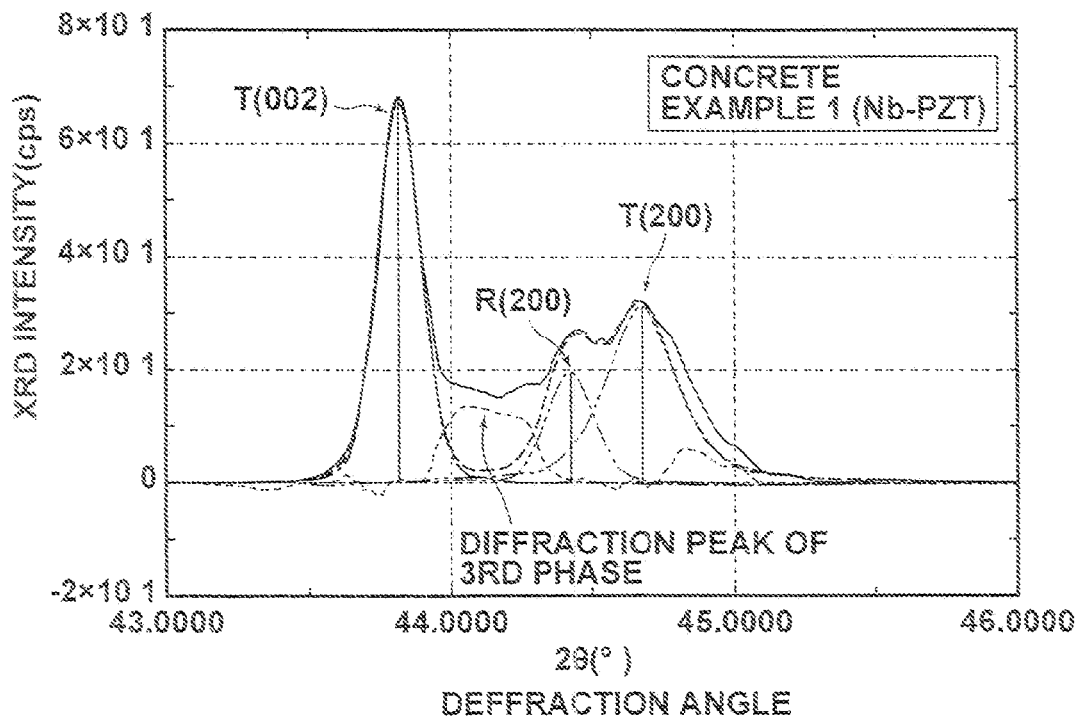
FIG. 9A is a high-resolution XRD (X-ray diffraction) profile of a piezoelectric body in a concrete example 1.
Figure 9B:
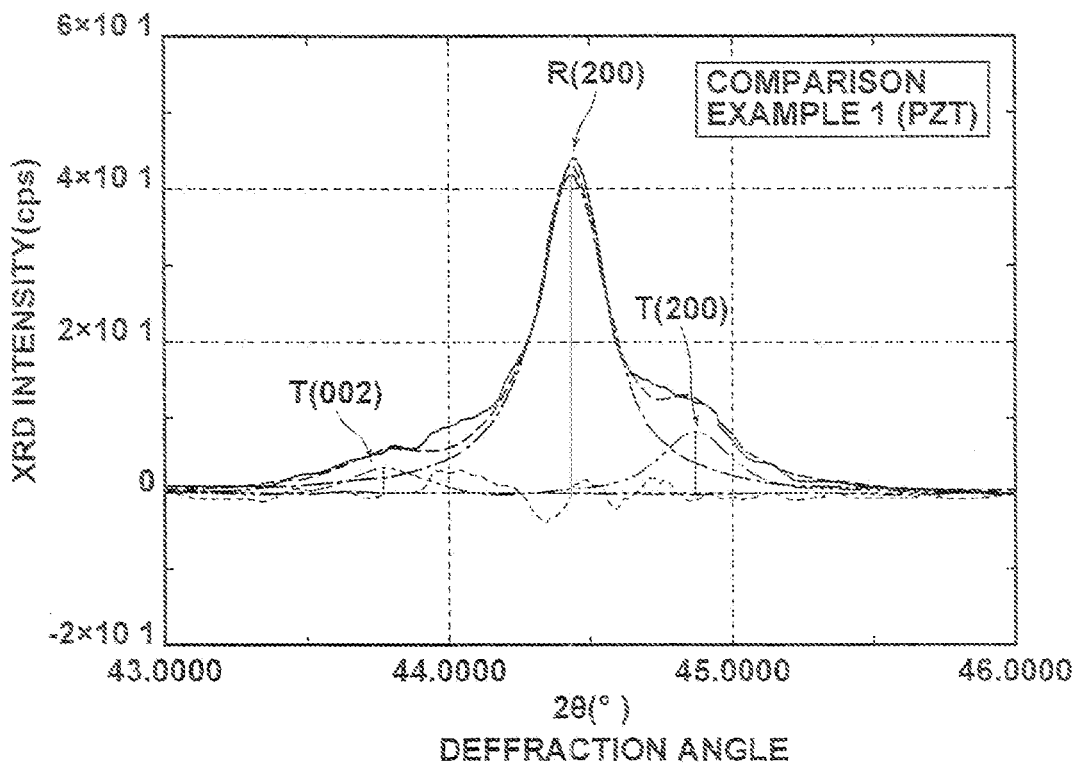
FIG. 9B is a high-resolution XRD profile of a piezoelectric body in a comparison example 1.

On the other hand, as indicated in FIG. 9A, a (200) diffraction peak of a rhombohedral phase (R), a (200) diffraction peak and a (002) diffraction peak of a tetragonal phase (T), and a diffraction peak of a third phase different from the rhombohedral and tetragonal phases are detected in the high-resolution XRD profile of the piezoelectric film in the concrete example 1 (using Nb-doped PZT).

The present inventor considers that the diffraction peak of the third phase corresponds to domains of $PbNbO_3$, which are produced by the doping with Nb, and the present inventor has obtained the lattice constant of the domains as 4.08 angstroms on the basis of the diffraction peak of the third phase. The obtained value, 4.08 angstroms, of the lattice constant approximately coincides with the value of the lattice constant which is expected when $PbNbO_3$, is assumed to form the cubic or pseudocubic phase.

Figure 10A:
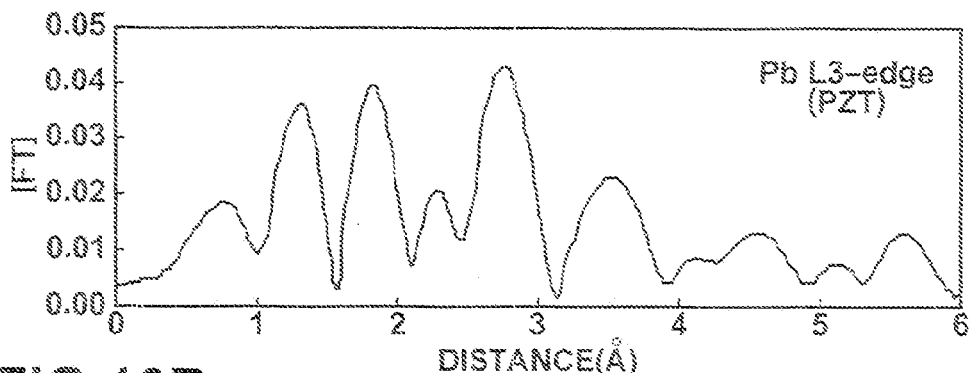
FIGS. 10A to 10D are diagrams indicating EXAFS (Extended X-ray Absorption Fine Structure) spectra of the piezoelectric bodies in the concrete example 1 and the comparison example 1.
Figure 10B:
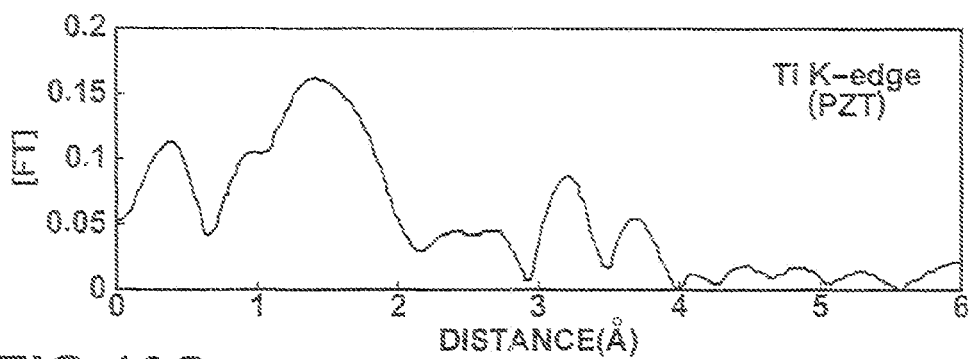
Figure 10C:
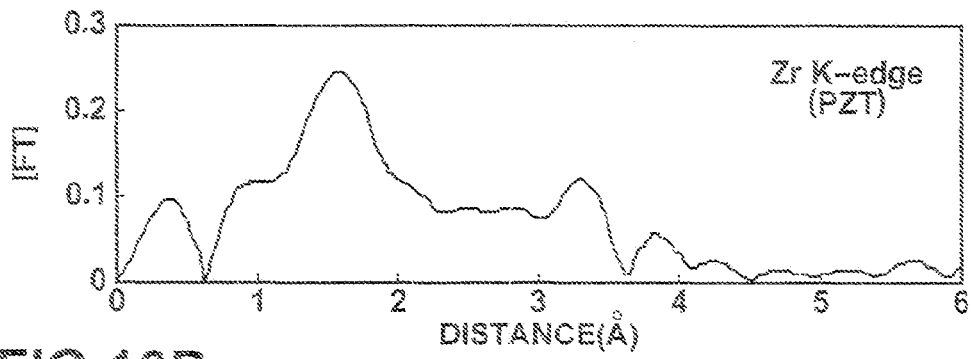
Figure 10D:
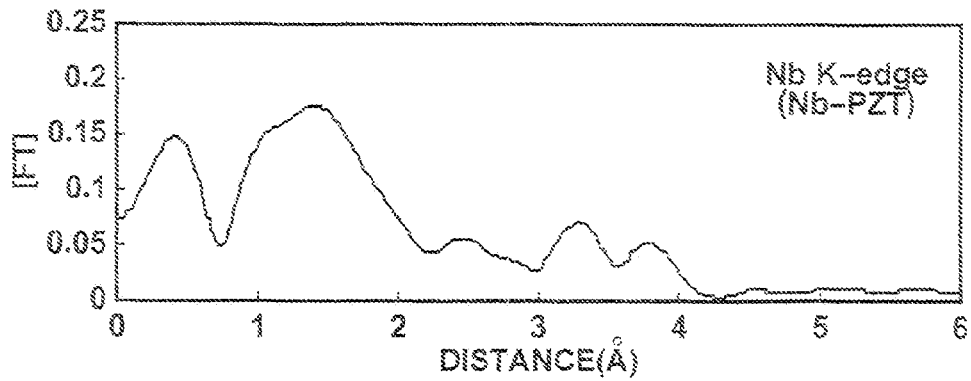

Next, the present inventor has performed structural analysis of the piezoelectric film in each of the concrete example 1 and the comparison example 1 by EXAFS (Extended X-ray Absorption Fine Structure) measurement. FIG. 10A shows a Pb L3-edge EXAFS spectrum of the piezoelectric film of undoped PZT in the comparison example 1, FIG. 10B shows a Ti K-edge EXAFS spectrum of the piezoelectric film of undoped PZT in the comparison example 1, FIG. 10C shows a Zr K-edge EXAFS spectrum of the piezoelectric film of undoped PZT in the comparison example 1, and FIG. 10D shows a Nb K-edge EXAFS spectrum of the piezoelectric film of Nb-doped PZT in the concrete example 1. Then, the bond distances in the bonds Ti—O, Zr—O, and Nb—O are obtained as indicated in Table 2.

As indicated in Table 2, the first bond distance near 1.8 angstroms and the second bond distance near 2.0 angstroms are detected for the bonds Ti—O in the piezoelectric (undoped PZT) film in each of the comparison example 1 and the concrete example 1. This means that the Ti ions reside at two different distances apart from the centers of unit cells (as illustrated in FIG. 4A), and the crystal system of PT ($PbTiO_3$) is the rhombohedral or tetragonal system.

On the other hand, only one bond distance is detected for the bonds Nb—O in the piezoelectric (Nb-doped PZT) film in the concrete example 1. This means that the Nb ions reside at the centers of unit cells. Although generally there is a possibility that the Nb ions reside at the centers of unit cells of rhombohedral or tetragonal crystals when the lattices of the rhombohedral or tetragonal crystals are distorted, the present inventor conjectures that the crystal system of $PbNbO_3$ is the cubic or pseudocubic system, in consideration of the facts that the tolerance factor (TF) of is $PbNbO_3$ is near 1.0, and the lattice constant of the third phase which is obtained from the high-resolution XRD profile approximately coincides with the value of the lattice constant which is expected when $PbNbO_3$ is assumed to form the cubic or pseudocubic phase.

Based on the measurement results of the high-resolution XRD and the EXAFS, it is possible to consider that the piezoelectric film formed in the concrete example 1 has a three-phase mixed-crystal structure of the tetragonal phase, the rhombohedral phase, and the cubic or pseudocubic phase.

TABLE 2

| | | Band Distance (Å) | | | |
|---|---|---|---|---|---|
| | | Ti-O | Ti-O | Zr-O | Nb-O |
| Concrete Example 1 | Nb-PZT | 1.82 | 1.99 | 2.03 | 1.96 |
| Comparison 1 | PZT | 1.83 | 2.01 | 2.04 | — |

8.4 Concrete Example 2

The concrete example 2 of the piezoelectric device according to the present invention is produced as follows.

First, an $SiO_2/Si$ substrate in which the $SiO_2$ layer has a thickness of 0.1 micrometers is prepared. Then, a contact layer of titanium having a thickness of 20 nm is formed on the $SiO_2/Si$ substrate, and a lower electrode of platinum having a thickness of 0.2 micrometers is formed by sputtering. Thereafter, a piezoelectric film of Nb-doped PZT, $Pb(Ti, Zr, Nb)O_3$ (specifically, $PbZr_{0.44}Ti_{0.44}Nb_{0.12}O_3$) having a thickness of 5.0 micrometers is formed by sputtering at the substrate temperature of 525° C., and is then annealed at 650° C. in oxygen atmosphere. Further, an upper electrode of platinum having a thickness of 0.2 micrometers is formed on the piezoelectric film by sputtering. Thus, a piezoelectric device according to the present invention is obtained.

Figure 11:
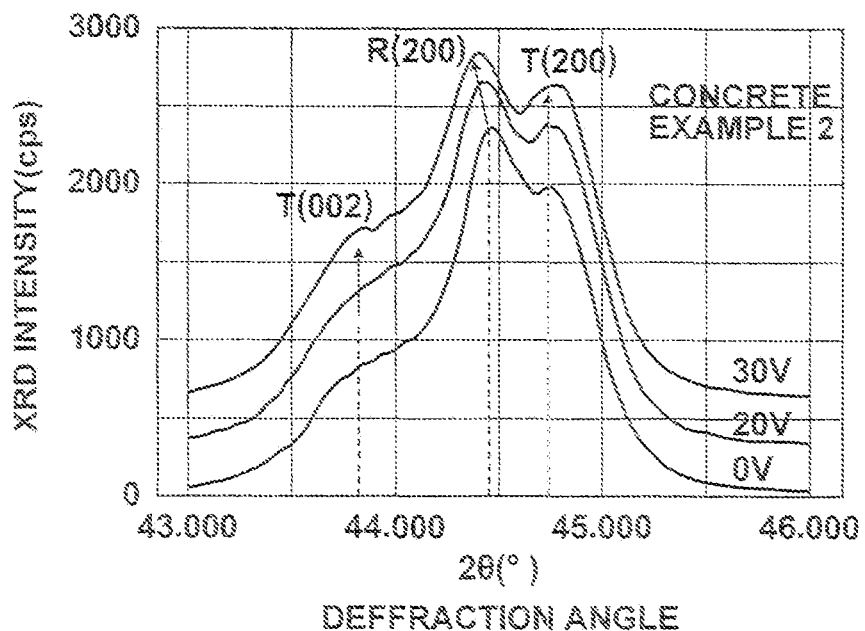
FIG. 11 is a diagram indicating high-resolution XRD profiles of a piezoelectric body in a concrete example 2 which are obtained at different levels of the electric field strength.

The present inventor has performed high-resolution X-ray diffraction (high-resolution XRD) measurement of the above piezoelectric film in the concrete example 2, and confirmed that the piezoelectric film has a three-phase mixed-crystal structure similar to the concrete example 1. Further, the present inventor has performed XRD measurement while applying an electric field, and confirmed that a portion of a rhombohedral phase (R) transitions to a tetragonal phase when the electric field is applied along the <001> direction. FIG. 11 shows high-resolution XRD profiles of the piezoelectric body in the concrete example 2 which are obtained at different levels of the electric field strength. FIG. 11 indicates that the diffraction peak of the rhombohedral phase (R) shifts when the electric field strength is increased. This is because when the electric field strength is increased, the crystal lattice of the rhombohedral phase expands in the direction of the applied electric field, so that the lattice constant increases. This is a piezoelectric distortion caused by the engineered-domain effect. FIG. 11 also indicates that the peak intensities of the (200) and (002) diffraction peaks of the tetragonal phase (T) increase when the electric field strength increases. This is because when the electric field strength is increased, a portion of the rhombohedral phase (R) transitions to the tetragonal phase.

Further, the present inventor has measured the piezoelectric coefficient $d_{31}$ in the range of the electric field strength between the minimum electric field strength Emin(=0 kV/cm (<E1)) and the maximum electric field strength Emax(=100 kV/cm(>E2)) by using a cantilever, and obtained the value of 250 pm/V. This value of the piezoelectric coefficient $d_{31}$ is the highest value in the world at present as long as the present inventor knows.

8.5 Comparison Example 2

The comparison example 2 of the piezoelectric device is produced as follows.

First, a lower electrode of platinum having a thickness of 0.2 micrometers is formed by sputtering on a (100) MgO substrate. Then, a piezoelectric film of undoped PZT, Pb(Ti, Zr)O$_3$ (specifically, PbZr$_{0.55}$Ti$_{0.45}$O$_3$) having a thickness of 5 micrometers is formed by pulsed-laser deposition at the substrate temperature of 525° C. Further, an upper electrode of platinum having a thickness of 0.2 micrometers is formed on the piezoelectric film by sputtering. Thus, a piezoelectric film as the comparison example 2 is obtained.

The present inventor has performed high-resolution X-ray diffraction (high-resolution XRD) measurement of the above piezoelectric film in the comparison example 2, and confirmed that the piezoelectric film is formed of a rhombohedral phase (R) having crystal orientation (with the degree of crystal orientation of 95%) along the <001> direction when no electric field is applied, and the rhombohedral phase (R) transitions to a tetragonal phase (T) when an electric field is applied in the <001> direction. In this example, the direction of the applied electric field is identical to the orientation of the spontaneous polarization axis after the phase transition. The minimum electric field strength E1 at which the phase transition begins and the electric field strength E2 at which the phase transition from the rhombohedral phase (R) to the tetragonal phase (T) is substantially completed are respectively 110 kV/cm and 160 kV/cm.

Further, the present inventor has measured the piezoelectric coefficient d$_{31}$ of the piezoelectric film in the range of the electric field strength between the minimum electric field strength Emin(=50 kV/cm(<E1)) and the maximum electric field strength Emax(=200 kV/cm(>E2)) by using a cantilever, and obtained the value of 190 pm/V.

8.6 Comparison of Concrete Example 2 and Comparison Example 2

In each of the concrete example 2 and the comparison example 2, phase transition of a ferroelectric phase occurs in the piezoelectric film, and the electric field is applied to the piezoelectric film in the direction identical to the orientation of the spontaneous polarization axis of a ferroelectric phase after the phase transition under the condition that Emin<E1≦E2<Emax. Although the concrete example 2 and the comparison example 2 are similar in the above respects, the piezoelectric film in the concrete example 2 formed of Nb-doped PZT exhibits greater distortion at lower electric field strength than the piezoelectric film in the comparison example 2 formed of undoped PZT. That is, the effectiveness of the material design principle according to the present invention is proved. The present inventor considers that the piezoelectric film in the concrete example 2 exhibits the great distortion at the relatively low electric field strength for the reason which is explained before with reference to FIGS. 3A, 3B, and 3C by using the phase transition model 1.

8.7 Concrete Example 3

The concrete example 3 of the piezoelectric device according to the present invention is produced as follows.

First, an SiO$_2$/Si substrate in which the SiO$_2$ layer has a thickness of 0.1 micrometers is prepared. Then, a contact layer of titanium having a thickness of 20 nm is formed on the SiO$_2$/Si substrate, and a lower electrode of platinum having a thickness of 0.13 micrometers is formed by sputtering. Thereafter, a piezoelectric film of Nb-doped PZT, Pb(Ti, Zr, Nb)O$_3$ having a thickness of 2.4 micrometers is formed by sputtering at the substrate temperature of 525° C. Further, an upper electrode of platinum having a thickness of 0.2 micrometers is formed on the piezoelectric film by sputtering. Thus, a piezoelectric device according to the present invention is obtained.

The present inventor has performed thickness measurement and X-ray fluorescence (XRF) measurement of the piezoelectric film as the concrete example 3. Table 3 shows the measured values of the thickness and the composition (the mole fraction of each constituent element and the molar ratio of Zr/(Zr+Ti)).

TABLE 3

| | Film Thickness (μm) | Pb | Zr | Ti | Nb | Zr/(Zr + Ti) | ε | Pr (μC/cm$^2$) | Ec (kV/cm) | d$_{31}$ |
| --- | --- | --- | --- | --- | --- | --- | --- | --- | --- | --- |
| | | | Zr + Ti + Nb = 1 | | | | | | | |
| Concrete Example 3 | 2.4 | 1.05 | 0.47 | 0.44 | 0.09 | 0.52 | 610 | 24.6 | 69.1 | 250 |

8.8 Evaluation of Concrete Example 3

Figure 12:
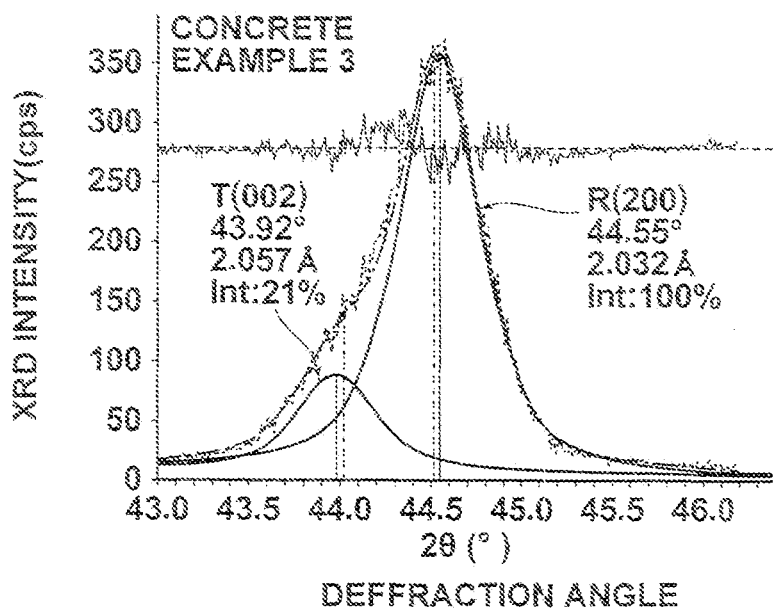
FIG. 12 is a diagram indicating a high-resolution XRD profile of a piezoelectric body in a concrete example 3.

The present inventor has performed high-resolution X-ray diffraction (high-resolution XRD) measurement of the piezoelectric film in the concrete example 3, and separated peaks in the obtained XRD profiles. FIG. 12 shows a high-resolution XRD profile and the separated diffraction peaks of the piezoelectric film in the concrete example 3. In FIG. 12, the diffraction angle (in degrees) of each diffraction peak, the lattice constant obtained on the basis of the diffraction angle, and the integrated intensity Int (%) of each diffraction peak normalized by the integrated intensity of the largest diffraction peak are indicated in association with each other.

As indicated in FIG. 12, only a strong (200) diffraction peak of a rhombohedral phase (R) and a weak diffraction peak (which appears on the left side of the strong (200) diffraction peak of the rhombohedral phase (R)) are detected in the high-resolution XRD profile of the piezoelectric film in the comparison example 3. Normally, XRD profiles having a (200) diffraction peak of a rhombohedral phase (R) and a (002) diffraction peak of a tetragonal phase (T) also have a (200) diffraction peak of the tetragonal phase (T) on the right side of the (200) diffraction peak of the rhombohedral phase (R). Therefore, the XRD profile of FIG. 12 is different from the normal XRD profiles as above. Therefore, the present inventor considers that the weak diffraction peak is a (002) diffraction peak of a tetragonal phase (T), which corresponds to the tetragonal domains behaving as the seeds of phase transition explained before with reference to FIGS. 5A, 5B, and 5C by using the phase transition model 2.

The present inventor has performed XRD measurement of the piezoelectric film in the concrete example 3 while applying an electric field to the piezoelectric film in the <001> direction, and confirmed that the rhombohedral phase (R) transitions to the tetragonal phase (T).

Furthermore, the present inventor has produced a diaphragm-type piezoelectric device as the concrete example 3, measured a relationship between the electric field strength and the displacement in the piezoelectric device and a relationship between the electric field strength and the dielectric polarization in the piezoelectric device, and obtained curves indicating the relationships. In the curve indicating the relationship between the electric field strength and the displacement in the piezoelectric device (the electric field-displacement curve), an inflection point (at which the gradient of the electric field-displacement curve changes) exists at each of the minimum electric field strength E1 (at which the phase transition begins) and the electric field strength E2 (at which the phase transition ends). The minimum electric field strength E1 at which the phase transition from the rhombohedral phase (R) to the tetragonal phase (T) begins is detected to be 45 kV/cm, and the electric field strength E2 at which the phase transition from the rhombohedral phase (R) to the tetragonal phase (T) is substantially completed is detected to be 67 kV/cm. These results of the measurement on the basis of the electric field-displacement curve coincide with the results of the XRD measurement of the piezoelectric film to which the electric field is applied. Thus, the above results obtained from the electric field-displacement curve and the XRD measurement confirm that the phase transition occurs.

Further, the present inventor has measured the piezoelectric coefficient $d_{31}$ of the piezoelectric film in the range of the electric field strength between the minimum electric field strength Emin(=0 kV/cm (<E1)) and the maximum electric field strength Emax(=100 kV/cm (>E2)), and obtained the value of 250 pm/V. Table 3 also shows the values of the piezoelectric coefficient $d_{31}$ (obtained by driving the piezoelectric device as the concrete example 3 in the range of the electric field strength from 0 to 100 kV/cm) and the dielectric constant ∈ measured at the frequency of 100 kHz.

Moreover, the present inventor has obtained the curve indicating the relationship between the electric field strength and the dielectric polarization in the piezoelectric device as the concrete example 3 by driving the piezoelectric device in the range of the electric field strength from −200 to 200 kV/cm), and measured the values of the residual dielectric polarization Pr (which is measured at the electric field strength equal to zero) and the coercive electric field Ec, which are also indicated in Table 3.

8.9 Concrete Example 4

The concrete example 4 according to the present invention is produced as follows.

The present inventor has designed a material for a film of the perovskite oxide Bi (Al, Fe, Sc)O$_3$ is designed by selecting BiAlO$_3$ (having the tolerance factor TF of 1.012) as the first component (having the tolerance factor TF greater than 1.0), BiScO$_3$ (having the tolerance factor TF of 0.911) as the second component (having the tolerance factor TF smaller than 1.0), and BiFeO$_3$ (having the tolerance factor TF of 0.960) as the third component, and determined the composition Bi Al$_{0.6}$Fe$_{0.35}$Sc$_{0.05}$ O$_3$ (which is at or near the MPB) on the basis of the recognition that the tolerance factor TF of Bi Al$_{0.6}$Fe$_{0.35}$Sc$_{0.05}$O$_3$ is 0.989.

Next, the film of the perovskite oxide having the above composition is produced as follows.

First, an SiO$_2$/Si substrate in which the SiO$_2$ layer has a thickness of 0.1 micrometers is prepared. Then, a contact layer of titanium having a thickness of 20 nm is formed on the SiO2$_2$/Si substrate, and a lower electrode of platinum having a thickness of 0.2 micrometers is formed by sputtering. Thereafter, a piezoelectric film of Bi(Al, Fe, Sc)O$_3$ (specifically, Bi Al$_{0.6}$Fe$_{0.35}$Sc$_{0.05}$O$_3$) having a thickness of 0.6 micrometers is formed by PLD (pulsed-laser deposition) at the substrate temperature of 670° C.

Figure 13A:
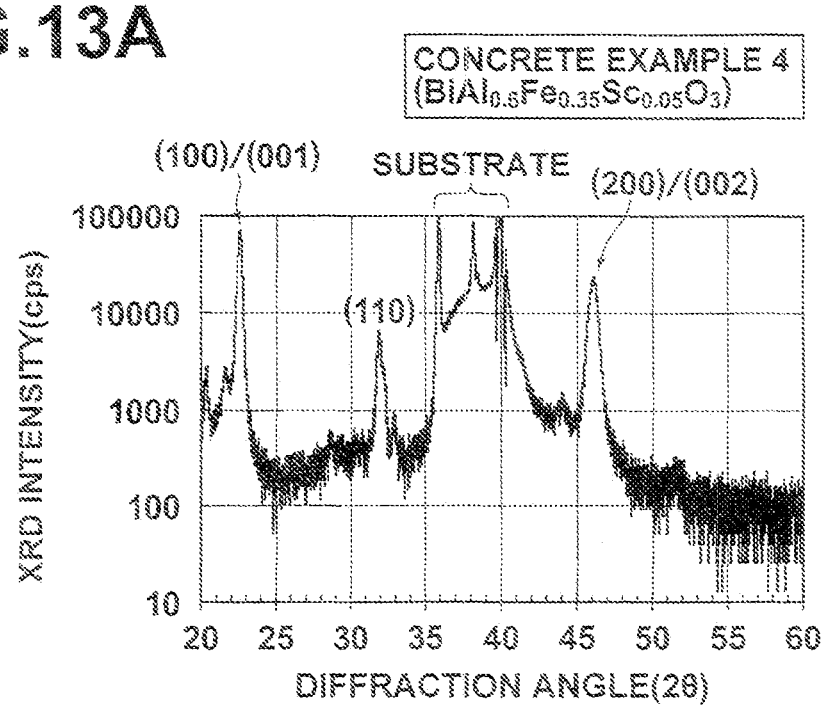
FIG. 13A is a diagram indicating an XRD profile of a piezoelectric body in a concrete example 4.
Figure 13B:
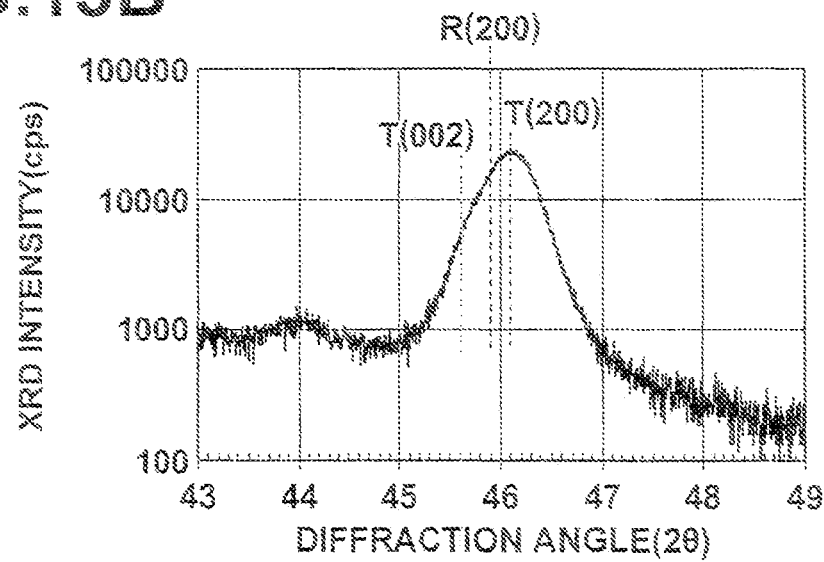
FIG. 13B is a diagram indicating a magnification of a portion of the XRD profile of FIG. 13A around the diffraction angle (2θ) of 46 degrees.
Figure 14:
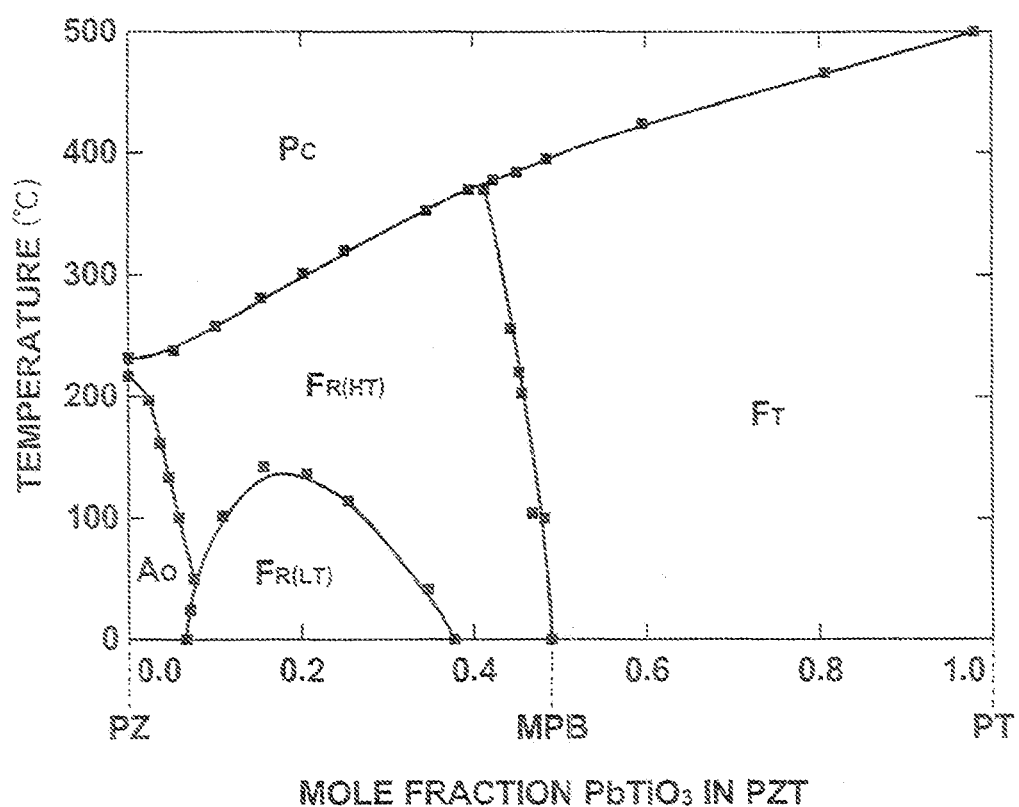
FIG. 14 is a phase diagram of PZT.

The present inventor has performed X-ray diffraction (XRD) measurement of the piezoelectric film formed as above, and the XRD profile of the piezoelectric body as the concrete example 4 is shown in FIG. 13A. As indicated in FIG. 13A, the above film is formed of a single perovskite phase, and is preferentially (100)/(001) oriented. A magnification of a portion of the XRD profile of FIG. 13A around the diffraction angle (2θ) of 46 degrees is shown in FIG. 13B. FIG. 13B shows that the (200) diffraction peak of the above film has a left shoulder, and is asymmetric. As indicated in FIG. 13B, the present inventor has confirmed that the tetragonal phase (T) and the rhombohedral phase (R) are mixed in the above film.

8.10 Comparison Example 3

A Bi(Al, Fe, Sc)O$_3$ film as the comparison example 3 is produced in a similar manner to the concrete example 4 except that the piezoelectric film as the comparison example 3 is made of BiAl$_{0.3}$Fe$_{0.65}$Sc$_{0.05}$O$_3$, the tolerance factor TF of which is 0.973. The present inventor has performed X-ray diffraction (XRD) measurement of the piezoelectric film as the comparison example 3, and confirmed that the piezoelectric film as the comparison example 3 is formed of a single perovskite phase, and only the rhombohedral phase (R) is observed.

9. Additional Matters

The piezoelectric devices according to the present invention can be preferably used in piezoelectric actuators, ferroelectric memories (FRAMs), and the like, where the piezoelectric actuators may be mounted in the inkjet recording heads, the magnetic recording-and-reproduction heads, MEMS (micro electromechanical systems) devices, micropumps, ultrasonic probes, and the like.

What is claimed is:

1. A piezoelectric oxide having a composition expressed by a compositional formula, (A,B,C)(D,E,F)O$_3$, where each of A, B, C, D, E, and F represents one or more metal elements, A, B, and C represent A-site elements, D, E, and F represent B-site elements, O represents the oxygen atom, the B-site elements D, E, and F are different when two or all of the A-site elements A, B, and C are identical, the A-site elements A, B, and C are different when two or all of the B-site elements D, E, and F are identical, and the ratio of each of the total molar amount of the A-site elements and the total molar amount of the B-site elements to the molar amount of oxygen atoms may deviate from 1:3 within a range in which the composition expressed by the compositional formula (A, B, C)(D, E, F)O$_3$ can form a perovskite structure; wherein the composition of said perovskite oxide satisfies the conditions (1), (2), (3), and (4), $$0.98 \leq TF(P) \leq 1.01, \tag{1}$$

$$TF(ADO_3) > 1.0, \tag{2}$$

$$TF(BEO_3) < 1.0, \text{ and} \tag{3}$$

$$TF(BEO_3) < TF(CFO_3) < TF(ADO_3), \tag{4}$$

where TF(P) is a tolerance factor of the piezoelectric oxide expressed by the compositional formula (A, B, C)(D, E, F)O$_3$, TF(ADO$_3$) is a tolerance factor of a compound expressed by a compositional formula ADO$_3$, TF(BEO$_3$) is a tolerance factor of a compound expressed by a compositional formula BEO$_3$, and TF(CFO$_3$) is a tolerance factor of a compound expressed by a compositional formula CFO$_3$, and wherein the A-site elements comprise Bi as an essemntial element, may further comprise Ba, and are free of Pb.

2. The piezoelectric oxide according to claim 1, wherein said composition of the perovskite oxide further satisfies the condition (5), $$0.98 \leq TF(CFO_3) \leq 1.02 \tag{5}$$

3. The piezoelectric oxide according to claim 1, wherein said composition is expressed by a compositional formula, $$(A,B,C)DO_3,$$

where each of A, B, C, and D represents one or more metal elements, A, B, and C represent A-site elements, D represents one or more B-site elements, O represents the oxygen element, and the A-site elements A, B, and C are different, and said composition of said perovskite oxide satisfies the conditions (1a), (2a), (3a), and (4a), $$0.98 \leq TF(P1) \leq 1.01, \tag{1a}$$

$$TF(ADO_3) > 1.0, \tag{2a}$$

$$TF(BDO_3) < 1.0, \text{ and} \tag{3a}$$

$$TF(BDO_3) < TF(CDO_3) < TF(ADO_3), \tag{4a}$$

where TF(P1) is a tolerance factor of the perovskite oxide, TF(BDO$_3$) is a tolerance factor of a compound BDO$_3$, and TF(CDO$_3$) is a tolerance factor of a compound CDO$_3$.

4. The piezoelectric oxide according to claim 3, wherein said composition of the perovskite oxide further satisfies the condition (5a), $$0.98 \leq TF(CDO_3) \leq 1.02 \tag{5a}$$

5. The piezoelectric oxide according to claim 1, wherein said composition is expressed by a compositional formula, $$A(D,E,F)O_3,$$

where each of A, D, E, and F represents one or more metal elements, A represents one or more A-site elements, D, E, and F represent B-site elements, O represents the oxygen element, and the B-site elements D, E, and F are different, and said composition of said perovskite oxide satisfies the conditions (1b), (2b), (3b), and (4b), $$0.98 \leq TF(P2) \leq 1.01, \tag{1b}$$

$$TF(ADO_3) > 1.0, \tag{2b}$$

$$TF(AEO_3) < 1.0, \text{ and} \tag{3b}$$

$$TF(AEO_3) < TF(AFO_3) < TF(ADO_3), \tag{4b}$$

where TF(P2) is a tolerance factor of the perovskite oxide, TF(AEO$_3$) is a tolerance factor of a compound AEO$_3$, and TF(AFO$_3$) is a tolerance factor of a compound AFO$_3$.

6. The piezoelectric oxide according to claim 5, wherein said composition of the perovskite oxide further satisfies the condition (5b), $$0.98 \leq TF(AFO_3) \leq 1.02 \tag{5b}$$

7. The piezoelectric oxide according to claim 1, containing a first component ADO$_3$, a second component BEO$_3$, and a third component CFO$_3$, where the ratio of each of the molar amount of an A-site element and the molar amount of a B-site element to the molar amount of oxygen atoms in each of the first component ADO$_3$, the second component BEO$_3$, and the third component CFO$_3$ may deviate from 1:3 within a range in which said each of the first component ADO$_3$, the second component BEO$_3$, and the third component CFO$_3$ can form a perovskite structure.

8. The piezoelectric oxide according to claim 7, wherein said first component and said second component each form a crystal structure corresponding to a different crystal system.

9. The piezoelectric oxide according to claim 7, wherein said first component, said second component, and said third component each form a crystal structure corresponding to a different crystal system.

10. The piezoelectric oxide according to claim 8, wherein said first component forms a first crystal structure corresponding to one of tetragonal, orthorhombic, monoclinic, trigonal, and rhombohedral systems, and said second component forms a second crystal structure corresponding to one of tetragonal, orthorhombic, and rhombohedral systems which is different from the first crystal structure.

11. The piezoelectric oxide according to claim 10, wherein said first crystal structure corresponds to the tetragonal system, and said second crystal structure corresponds to the rhombohedral system.

12. The piezoelectric oxide according to claim 9, wherein said first component forms a first crystal structure corresponding to one of tetragonal, orthorhombic, monoclinic, trigonal, and rhombohedral systems, and said second component forms a second crystal structure corresponding to one of tetragonal, orthorhombic, and rhombohedral systems which is different from the first crystal structure.

13. The piezoelectric oxide according to claim 12, wherein said first crystal structure corresponds to the tetragonal system, and said second crystal structure corresponds to the rhombohedral system.

14. The piezoelectric oxide according to claim 9, wherein said first component forms a first crystal structure corresponding to one of tetragonal, orthorhombic, monoclinic, trigonal, and rhombohedral systems, said second component forms a second crystal structure corresponding to one of tetragonal, orthorhombic, and rhombohedral systems which is different from the first crystal structure, and said third component forms a third crystal structure corresponding to one of cubic and pseudocubic systems.

15. The piezoelectric oxide according to claim 14, wherein said first crystal structure corresponds to the tetragonal system, and said second crystal structure corresponds to the rhombohedral system.

16. The piezoelectric oxide according to claim 1, wherein said composition is expressed by a compositional formula, $$(Ba,Ca,Sr)(Ti,Zr,M)O_3,$$

where M is at least one of the metal elements Sn, Nb, Ta, Mo, W, Ir, Os, Pd, Pt, Re, Mn, Co, Ni, V, and Fe.

17. The piezoelectric oxide according to claim 1, wherein said composition is expressed by a compositional formula, $$Bi(Al,Fe,M)O_3,$$

where M is at least one of the metal elements Cr, Mn, Co, Ni, Ga, and Sc.

18. A ferroelectric compound containing the perovskite oxide according to claim 1.

19. A piezoelectric body containing the perovskite oxide according to claim 1.

20. The piezoelectric body according to claim 19, having a form of a piezoelectric film or a sintered ceramic body.

21. The piezoelectric body according to claim 19, containing a ferroelectric phase which has crystal orientation.

22. The piezoelectric body according to claim 21, containing at least one ferroelectric phase, where each of the at least one ferroelectric phase has a spontaneous polarization axis along a first direction and crystal orientation along a second direction different from the first direction.

23. The piezoelectric body according to claim 22, wherein said at least one ferroelectric phase is at least one of a rhombohedral phase having crystal orientation along approximately a <100> direction, a rhombohedral phase having crystal orientation along approximately a <110> direction, a tetragonal phase having crystal orientation along approximately a <110> direction, a tetragonal phase having crystal orientation along approximately a <111> direction, an orthorhombic phase having crystal orientation along approximately a <100> direction, and an orthorhombic phase having crystal orientation along approximately a <111> direction.

24. The piezoelectric body according to claim 22, wherein at least a portion of said each of the at least one ferroelectric phase transitions to another ferroelectric phase corresponding to a crystal system different from a crystal system corresponding to said each of the at least one ferroelectric phase, when an electric field is applied to said piezoelectric body along a direction different from said first direction.

25. A piezoelectric device comprising:
the piezoelectric body according to claim 22; and
electrodes through which an electric field is applied to the piezoelectric body.

26. The piezoelectric device according to claim 25, wherein said electric field applied to the piezoelectric body through said electrodes is along a direction different from said first direction.

27. A liquid discharge device comprising:
a substrate;
the piezoelectric device according to claim 25 arranged above said substrate; and
a discharge member being formed integrally with or separately from said substrate, and including,
a liquid-reserve chamber which reserves liquid, and
a liquid-discharge outlet through which said liquid is discharged from the liquid-reserve chamber.

28. A piezoelectric device comprising:
the piezoelectric body according to claim 19; and
electrodes through which an electric field is applied to the piezoelectric body.

29. A liquid discharge device comprising:
a substrate;
the piezoelectric device according to claim 28 arranged above said substrate; and
a discharge member being formed integrally with or separately from said substrate, and including,
a liquid-reserve chamber which reserves liquid, and
a liquid-discharge outlet through which said liquid is discharged from the liquid-reserve chamber.

30. A piezoelectric oxide according to claim 1, wherein said composition is expressed by a compositional formula:

$$(Bi,Ba,G)(H,I,J)O_3,$$

wherein each of G, H, I and J represents one or more metal elements, G represents A-site elements, and H, I, and J represent B-site elements.

31. A piezoelectric oxide according to claim 30, wherein H is Fe and I is Ti.

* * * * *